United States Patent
Beard et al.

(10) Patent No.: US 12,252,396 B2
(45) Date of Patent: Mar. 18, 2025

(54) MULTI-LEVEL MICROELECTROMECHANICAL SYSTEM STRUCTURE WITH NON-PHOTODEFINABLE ORGANIC POLYMER SPACER LAYERS

(71) Applicant: TEXAS INSTRUMENTS INCORPORATED, Dallas, TX (US)

(72) Inventors: Christopher Murray Beard, Allen, TX (US); Song Zheng, Fairview, TX (US); John Wesley Hamlin, III, Dallas, TX (US); Win-Jae Jessie Yuan, Dallas, TX (US); Kelly Jay Taylor, Allen, TX (US); Jose Antonio Martinez Soto, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 256 days.

(21) Appl. No.: 17/728,844

(22) Filed: Apr. 25, 2022

(65) Prior Publication Data
US 2023/0127477 A1    Apr. 27, 2023

Related U.S. Application Data

(60) Provisional application No. 63/271,743, filed on Oct. 26, 2021, provisional application No. 63/271,749, filed on Oct. 26, 2021.

(51) Int. Cl.
*B81C 1/00* (2006.01)

(52) U.S. Cl.
CPC ...... *B81C 1/00396* (2013.01); *B81C 1/00523* (2013.01); *B81C 2201/013* (2013.01); *B81C 2201/0176* (2013.01); *B81C 2201/0181* (2013.01); *B81C 2201/0198* (2013.01)

(58) Field of Classification Search
None
See application file for complete search history.

(56) References Cited

U.S. PATENT DOCUMENTS

| | | | |
|---|---|---|---|
| 2006/0040501 A1* | 2/2006 | America | H01L 21/31144 257/E21.252 |
| 2006/0228869 A1* | 10/2006 | Haluzak | B81C 1/00269 438/458 |
| 2014/0227887 A1* | 8/2014 | Kim | C09D 161/14 524/592 |
| 2019/0304836 A1* | 10/2019 | Kikuchi | H01L 21/76805 |

* cited by examiner

*Primary Examiner* — Moazzam Hossain
(74) *Attorney, Agent, or Firm* — Michelle F. Murray; Frank D. Cimino

(57) ABSTRACT

In an example, a method includes depositing an organic polymer layer on one or more material layers. The method also includes thermally curing the organic polymer layer. The method includes depositing a hard mask on the organic polymer layer and depositing a photoresist layer on the hard mask. The method also includes patterning the photoresist layer to expose at least a portion of the hard mask. The method includes etching the exposed portion of the hard mask to expose at least a portion of the organic polymer layer. The method also includes etching the exposed portion of the organic polymer layer to expose at least a portion of the one or more material layers.

17 Claims, 16 Drawing Sheets

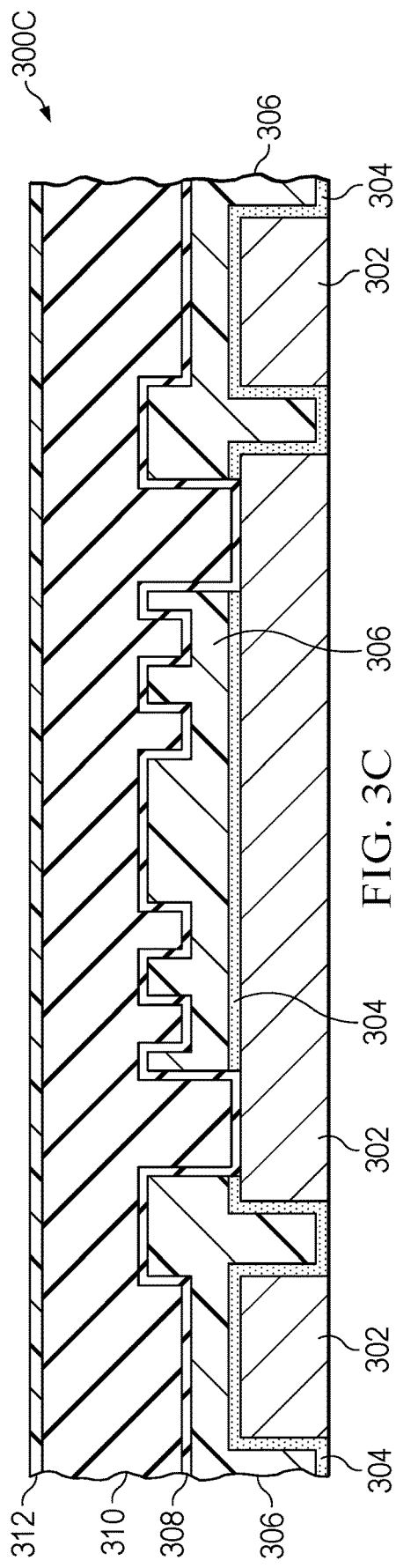
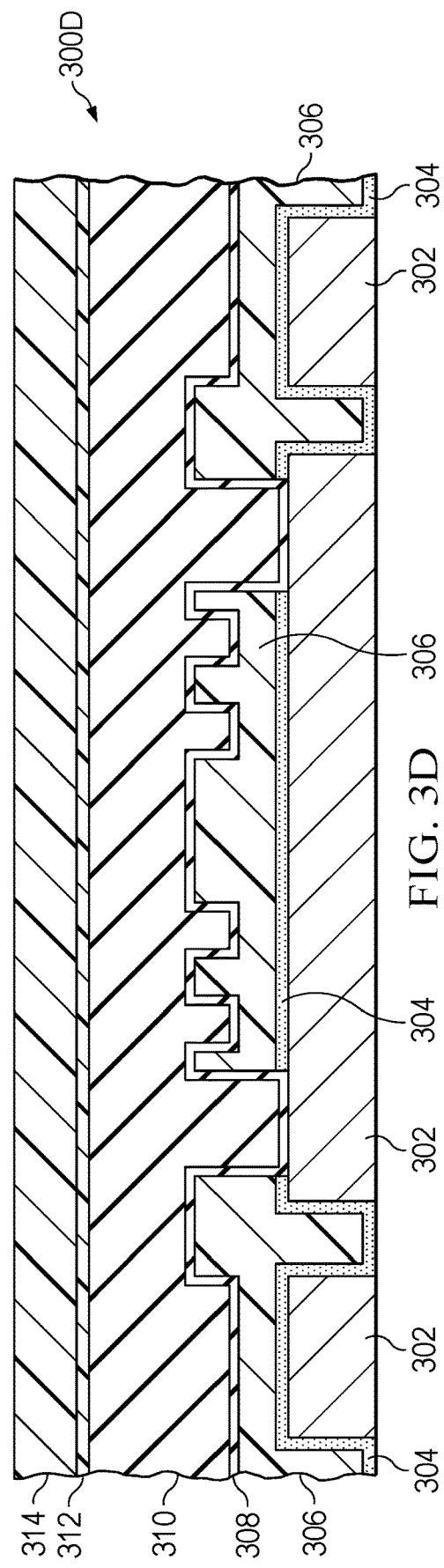

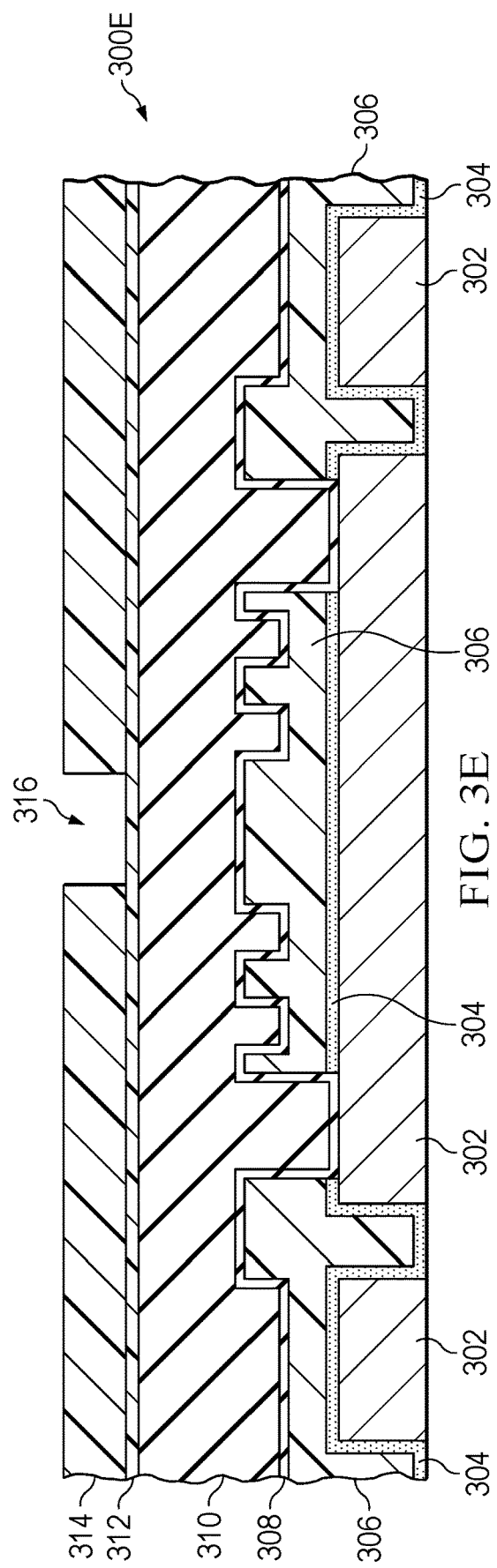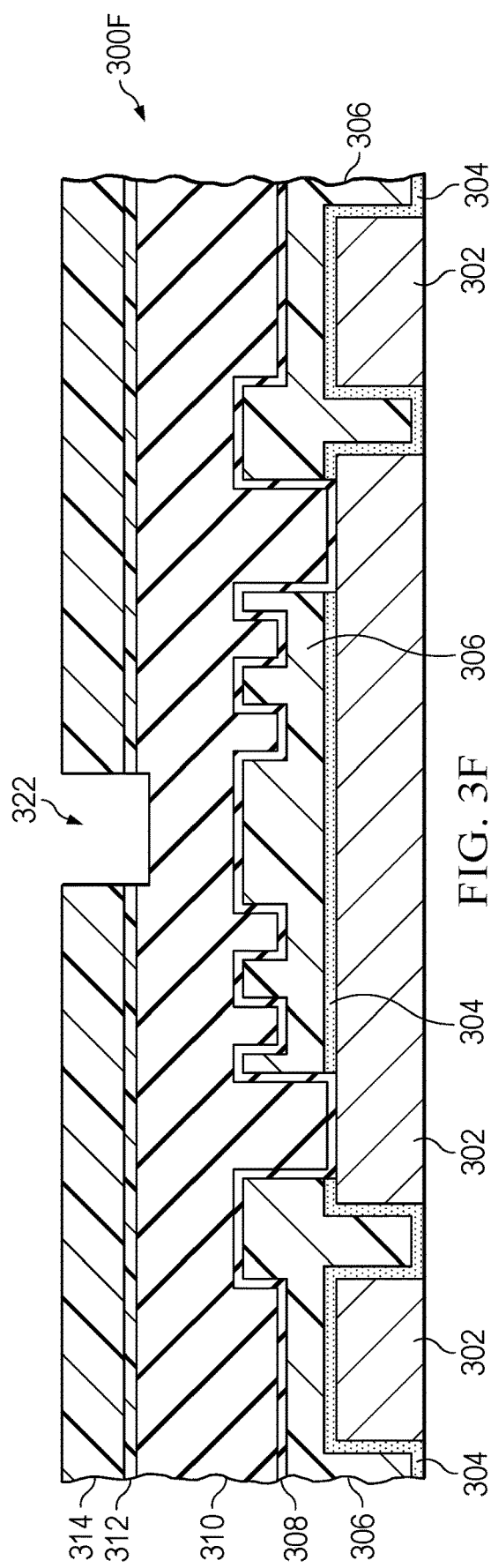

MULTI-LEVEL MICROELECTROMECHANICAL SYSTEM STRUCTURE WITH NON-PHOTODEFINABLE ORGANIC POLYMER SPACER LAYERS

CROSS-REFERENCE TO RELATED APPLICATIONS

The present application claims priority to U.S. Provisional Patent Application No. 63/271,743, filed Oct. 26, 2021, and entitled "Process to Create A Multi-Level Microelectromechanical System Structure With Non-Photodefinable Organic Polymer Spacer Layers," and to U.S. Provisional Patent Application No. 63/271,749, filed Oct. 26, 2021, and entitled "Structure And Method Of Formation Of MEMS Self-Aligned Anti-Reflective Coating Via And Post," which Applications are hereby incorporated herein by reference in their entirety.

BACKGROUND

Microelectromechanical systems (MEMS) is a technology involving small devices that combine mechanical and electrical components. For many MEMS devices, semiconductor device fabrication technologies may be useful. Some MEMS devices are fabricated by depositing, etching, and/or planarizing layers made of different materials, such as metals, oxides, and photoresist. The properties of the materials used for the different layers necessitate various mechanical and chemical processes to form the final MEMS device.

SUMMARY

In accordance with at least one example of the description, a method includes depositing an organic polymer layer on one or more material layers. The method also includes thermally curing the organic polymer layer. The method includes depositing a hard mask on the organic polymer layer and depositing a photoresist layer on the hard mask. The method also includes patterning the photoresist layer to expose at least a portion of the hard mask. The method includes etching the exposed portion of the hard mask to expose at least a portion of the organic polymer layer. The method also includes etching the exposed portion of the organic polymer layer to expose at least a portion of the one or more material layers.

In accordance with at least one example of the description, a method includes depositing one or more material layers on a substrate. The method also includes depositing an organic polymer layer on the one or more material layers. The method includes thermally curing the organic polymer layer. The method also includes depositing a hard mask on the organic polymer layer. The method includes depositing a photoresist layer on the hard mask. The method also includes patterning the photoresist layer to expose at least a portion of the hard mask. The method includes etching the exposed portion of the hard mask to expose at least a portion of the organic polymer layer. The method also includes etching the exposed portion of the organic polymer layer to expose at least a portion of the one or more material layers. The method includes etching at least one of the one or more material layers. The method also includes removing the hard mask with an etch process.

In accordance with at least one example of the description, a MEMS device includes an anti-reflective coating layer formed on a substrate of the MEMS device. The device includes a hinge formed on the substrate, where an edge of the hinge on the substrate is aligned with an edge of the anti-reflective coating layer. The device includes a mirror coupled to the hinge.

BRIEF DESCRIPTION OF THE DRAWINGS

FIGS. 3A to 3J are an example process flow for a MEMS device with an organic polymer spacer layer in accordance with various examples.

The same reference numbers or other reference designators are used in the drawings to designate the same or similar (functionally and/or structurally) features.

DETAILED DESCRIPTION

Figure 1A:
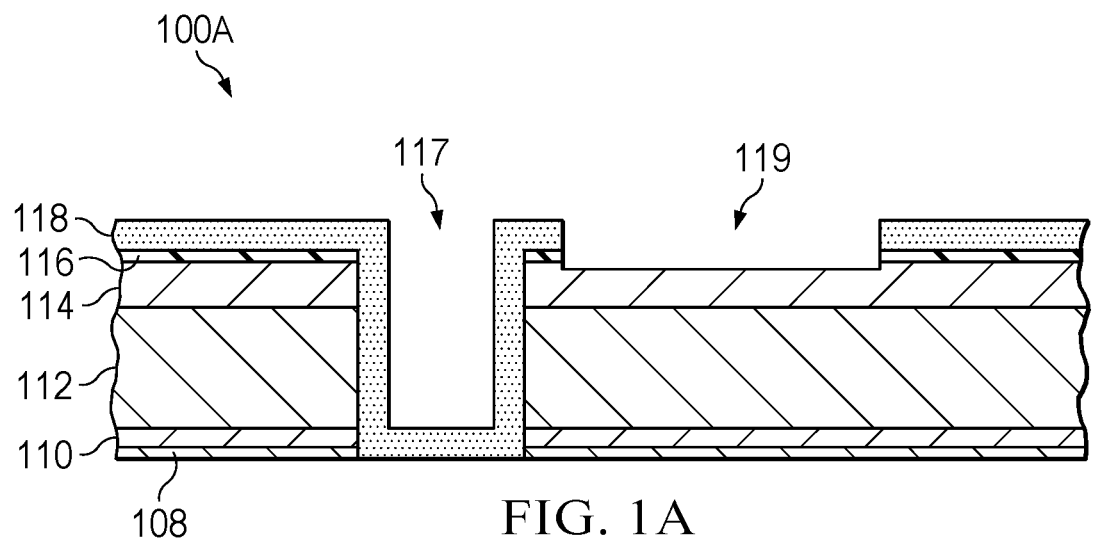
FIGS. 1A to 1J are an example process flow for a MEMS device with an organic polymer spacer layer in accordance with various examples.

MEMS devices may be manufactured and used for a variety of applications, such as accelerometers, microphones, micro-barometers, microsensors, and spatial light modulators (e.g., digital micromirror devices (DMDs)). For many MEMS devices, flat spacer layers are useful for building mechanical structures as a component of the MEMS device. The spacer layers may then be removed in a later manufacturing step to release the MEMS device, allowing it to operate. Flat spacer layers are useful in many applications. Also, as MEMS devices get smaller, the spacer layers may need to be thinner. In conventional processes, photoresist is useful for creating spacer layers. However, with existing photoresists it may be difficult to create flat spacer layers at certain thicknesses, such as thicknesses less than 400 nanometers (nm). In addition, planarization of thin photoresists may create poor results and require additional processing.

In examples herein, non-photodefinable organic spacer layers are used for the manufacture of MEMS devices. One example of a material for these spacer layers is a spin-on carbon (SOC), which is a type of organic spin-coated polymer. Other organic spin-coated polymers may be used in some examples. In one example, the organic polymer may be a spin-on dielectric material. In another example, the organic polymer may be a spin-on filling material for topography planarization. In another example, the organic polymer may be an anti-reflective coating for minimizing a standing wave and improving critical dimension uniformity. An organic polymer is a macromolecule composed of many repeating monomer units that contain carbon in the backbone. In examples herein, the SOC may be used to create spacer layers. The SOC is thermally cured at 180-220° C. in one example. A silicon-containing hard mask may be useful for etching vias into the SOC spacer layer. The SOC may also be an anti-reflective film, which reduces reflectivity in some MEMS devices. The SOC described herein may be capable of achieving a flatter spacer layer than photoresists in some examples. The SOC described herein may have improved etch selectivity, which allows for more precise etching of features in the MEMS device. The SOC is also capable of achieving thinner layers than a photoresist, which allows for smaller MEMS devices to be manufactured compared to conventional processes. The SOC may exhibit better planarization than photoresists, and may also fill gaps in other layers during manufacturing better than photoresists in some examples. The examples herein may reduce wafer costs by eliminating a pattern level during a manufacturing process. A conventional process may use separate patterning and etching steps to etch an anti-reflective coating (ARC) layer and a spacer layer, where the spacer layer is a photoresist layer. The ARC pattern level may be removed in some examples herein. For a spatial light modulator, a smaller pixel may be created. An improved sidewall for a via may be created with the examples herein by allowing for deeper trenching into a metal layer and depositing metal onto the sidewall of the via. An improved via sidewall profile may result in improvement to the structural integrity of the MEMS device. A reduction or removal of exposed reflective metal may improve contrast of the device.

In a MEMS device such as a spatial light modulator, spacer layers may be used to build three-dimensional mechanical structures such as hinges that allow a mirror to move or tilt during operation. In a MEMS accelerometer, a mass coupled to a spring may move due to an accelerating force. In a MEMS gyroscope, a mass coupled to a spring may also move to sense an angular rate. Mechanical MEMS devices may use gears, levers, bearings, cantilevers, actuators, linkages, and other components that move during operation. Spacer layers in these devices may be used to build these components as described herein, and then the spacer layers may be removed to release the components and allow them to operate.

FIGS. 1A-1J show an example process flow for a MEMS device with an organic polymer layer as a spacer layer in accordance with various examples herein. The components in FIGS. 1A to 1J are not necessarily drawn to scale. This example shows only a portion of the manufacturing steps for simplicity. The portion of the steps that are described herein relate to the etching of the organic polymer layer, which is an SOC spacer layer in this example. With the use of the SOC as a spacer layer, thinner, flatter, and more precise MEMS devices may be manufactured.

Figure 1B:
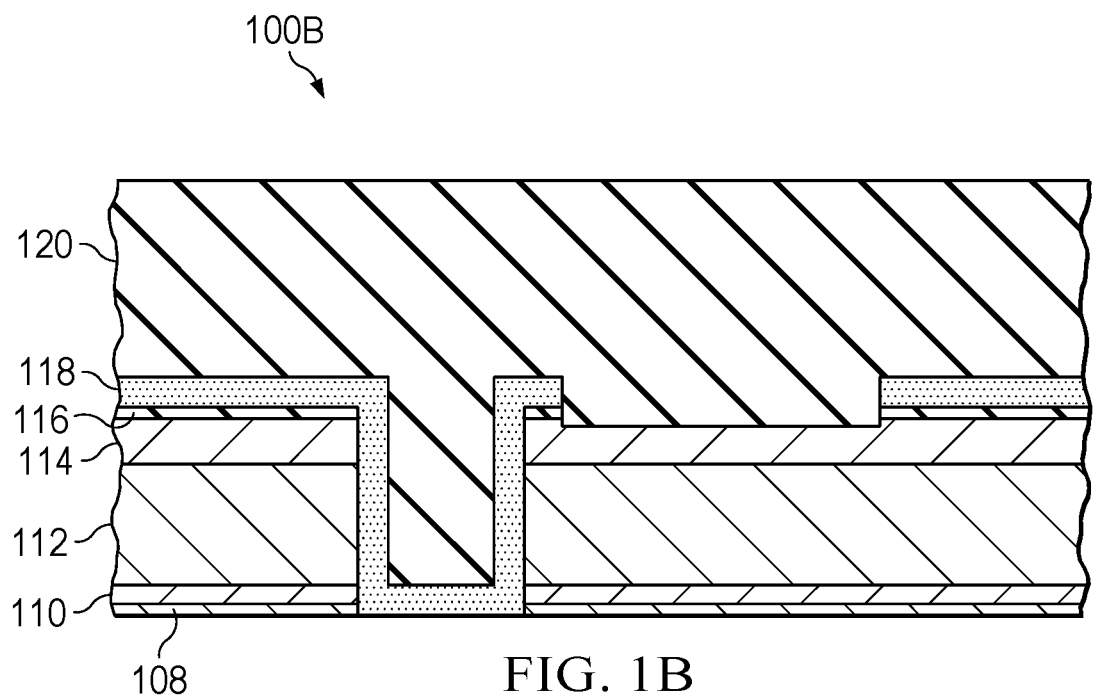
Figure 1C:
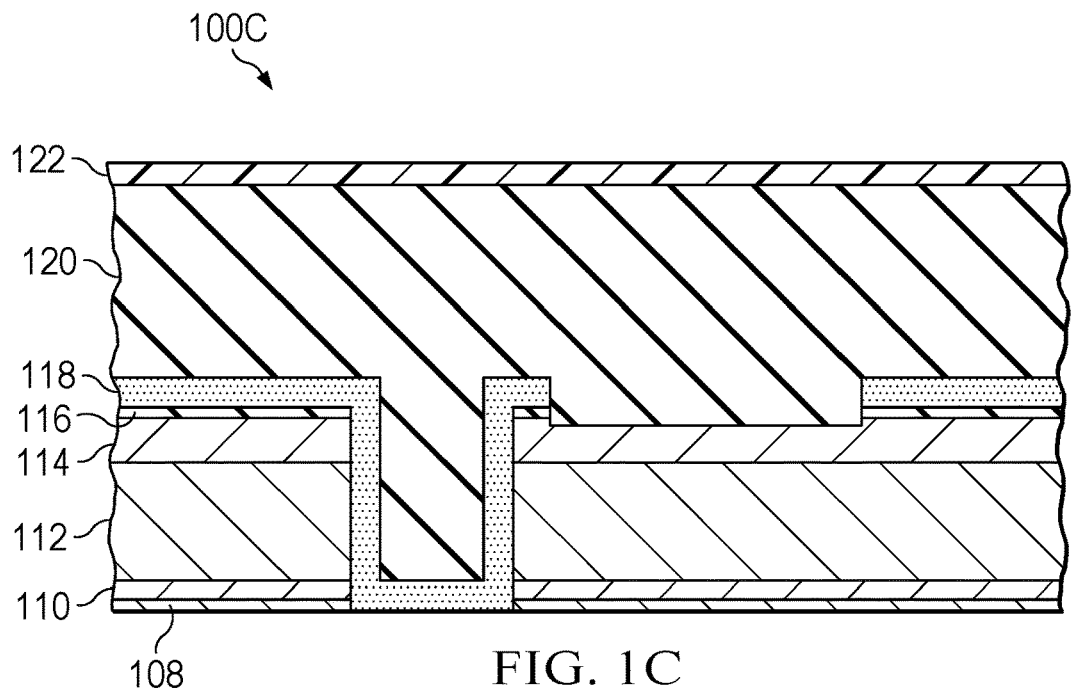

FIG. 1A shows a portion of a structure 100A of a MEMS device in accordance with an example herein. FIG. 1B shows a structure 100B, FIG. 1C shows a structure 100C, etc., to FIG. 1J, which shows a structure 100J. The structures shown in FIGS. 1A-1J may be a portion of a spatial light modulator (such as a DMD) in one example. However, the techniques described herein may be applied to other MEMS devices. Structure 100A includes a number of layers of different materials that have been deposited, patterned, and etched to create structure 100A shown in FIG. 1A. The details of the steps for creating structure 100A are omitted herein.

Structure 100A includes a number of material layers, including layers 108, 110, 112, 114, and 116. These layers may be metals, metal alloys, a substrate, or a components of an anti-reflective coating film stack. In some examples, the layers may include titanium, titanium nitride, an aluminum-titanium-silicon alloy, and/or titanium oxide. These layers have been deposited, patterned, and etched to form the structure shown here. Layer 118 is an anti-reflective coating (ARC) layer, referred to herein as an ARCox layer 118. Layer 118 provides an ARC for components of the final MEMS device after the spacer layers are removed. In some examples, layer 118 may include a deposited silicon dioxide layer that is part of an anti-reflective multilayer thin film system that reduces reflectance from metal layers. Structure 100A also includes a via 117 and an etched portion 119. The via 117 and etched portion 119 may be created using any suitable techniques.

FIG. 1B includes an SOC spacer layer 120. In other examples, other types of organic spin-coated polymers may be useful for SOC spacer layer 120. SOC spacer layer 120 may be deposited on structure 100A using any suitable technique to create structure 100B.

FIG. 1C shows a structure 100C. A hard mask 122 is deposited above SOC spacer layer 120 in structure 100C. In this example, hard mask 122 is a silicon nitride hard mask, such as $Si_3N_4$. Hard mask 122 may be deposited using chemical vapor deposition (CVD) in one example. Hard mask 122 may have a thickness of approximately 700 Angstroms in one example.

Figure 1D:
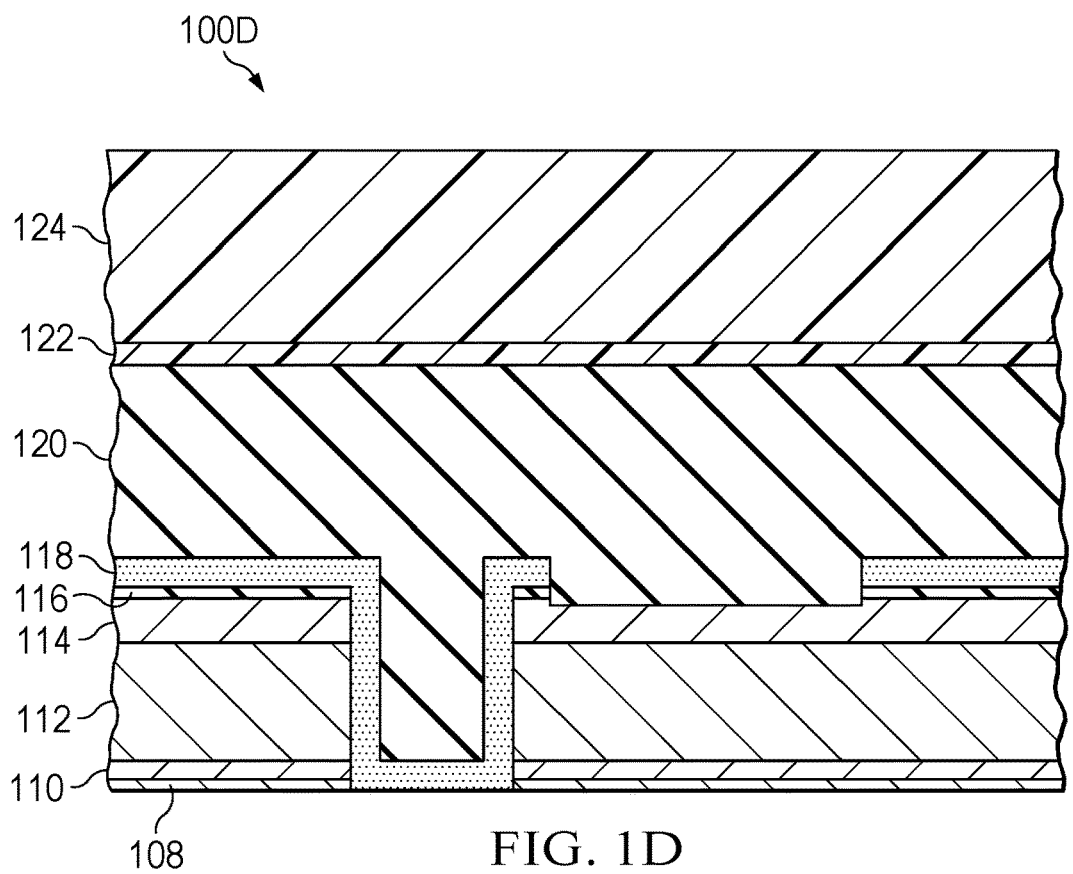

FIG. 1D shows a structure 100D that includes a photoresist 124 deposited on hard mask 122. Photoresist 124 may be any suitable photoresist, and photoresist 124 is patterned and etched as shown herein.

Figure 1E:
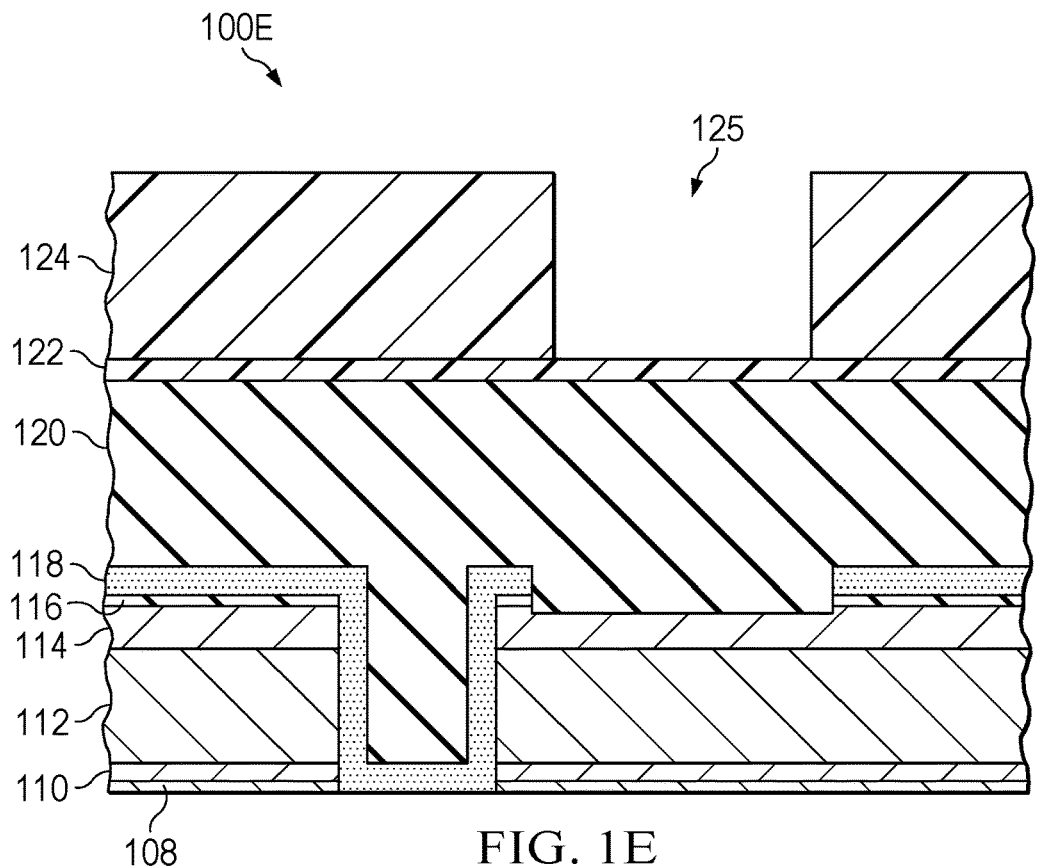

In FIG. 1E, photoresist 124 has been patterned and etched to remove a portion of photoresist 124 as shown in structure 100E and to create an etched portion 125. In this example, a hinge for an SLM will be produced in the subsequent steps described below. In other examples, other components of MEMS devices may be created.

Figure 1F:
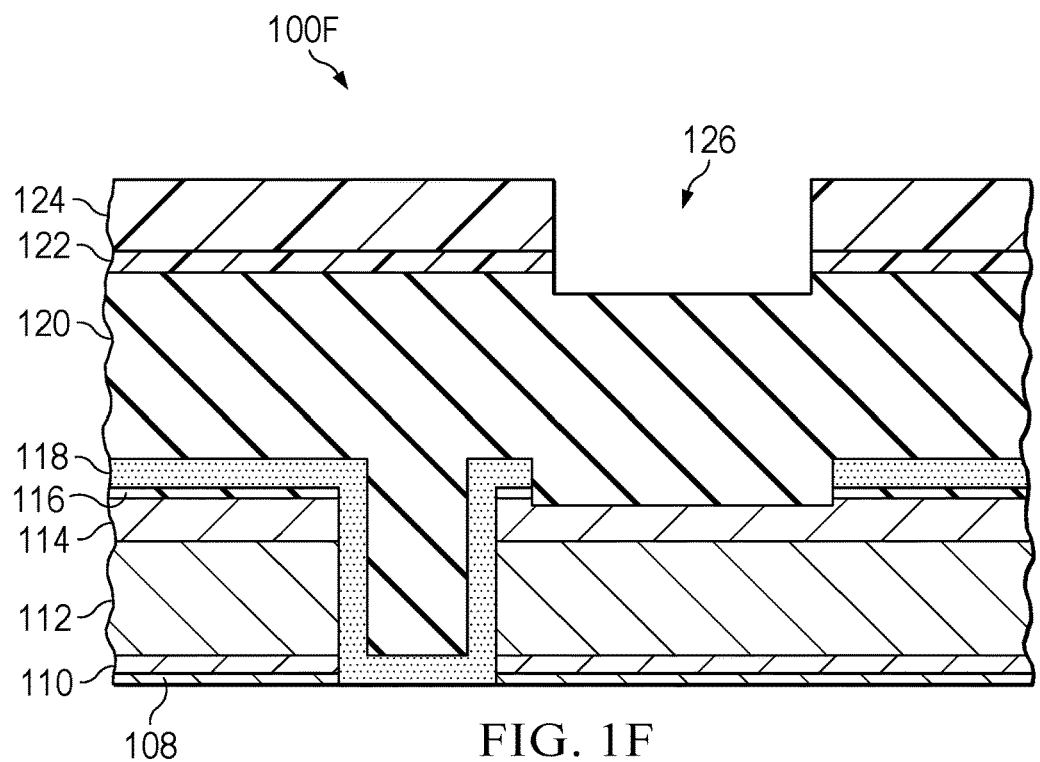

In FIG. 1F, an etch of hard mask 122 is performed to remove hard mask 122 at location 126. FIG. 1F shows structure 100F after the etch is performed on structure 100E of FIG. 1E. In one example, the etch is a fluorine-based etch. In this example, the etch selectivity between hard mask 122 and SOC spacer layer 120 may be approximately 1.4. The selectivity is the etch rate of the hard mask 122 divided by the etch rate of the SOC spacer layer 120. As shown in FIG. 1F, some of the SOC spacer layer 120 may be removed along with the hard mask 122, due to the small value of the selectivity for this etch.

Figure 1G:
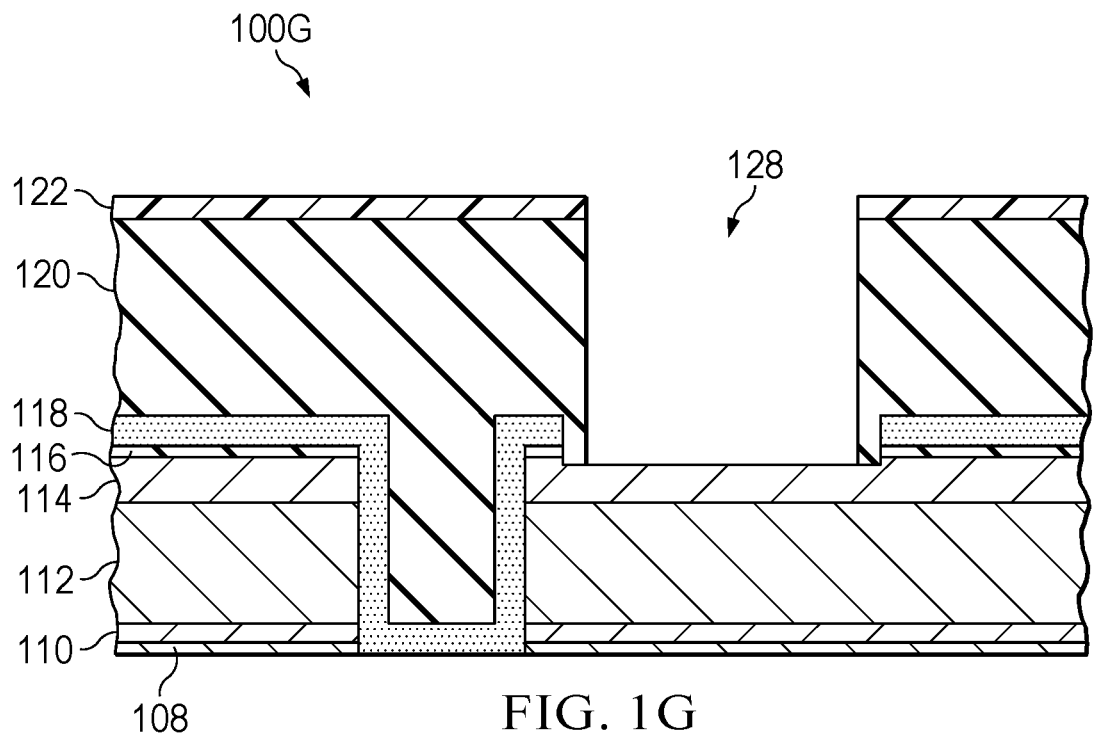

In FIG. 1G, an etch of SOC spacer layer 120 is performed to remove SOC spacer layer 120 at location 128. FIG. 1G shows structure 100G after the etch is performed on structure 100F of FIG. 1F. In one example, the etch is an oxygen-based etch using an oxygen-based etchant. In this example, the etch selectivity between SOC spacer layer 120 and hard mask 122 is greater than 80. A selectivity in this range allows SOC spacer layer 120 to be removed at location 128 while removing very little of hard mask 122. Also, photoresist 124 may be removed as shown in FIG. 1G.

Figure 1H:
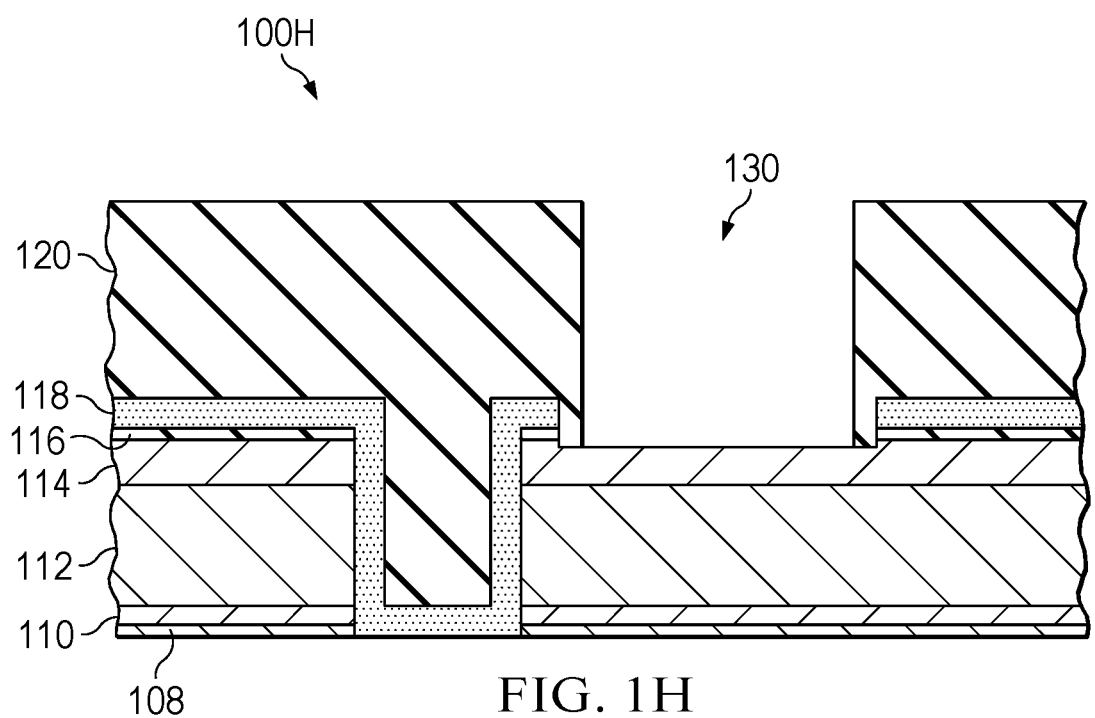

In FIG. 1H, another etch of hard mask 122 is performed to remove hard mask 122. FIG. 1H shows structure 100H after the etch is performed on structure 100G of FIG. 1G. In one example, the etch is a fluorine-based etch. In this example, the etch selectivity between hard mask 122 and SOC spacer layer 120 may be approximately 1.4. Also, in this example, removing hard mask 122 with an etch does not materially affect metal 114 at location 130. After this etch of hard mask 122 is performed, other processing steps may be performed using the remaining SOC spacer layer 120 as a spacer for creating components of the MEMS device.

Figure 1I:
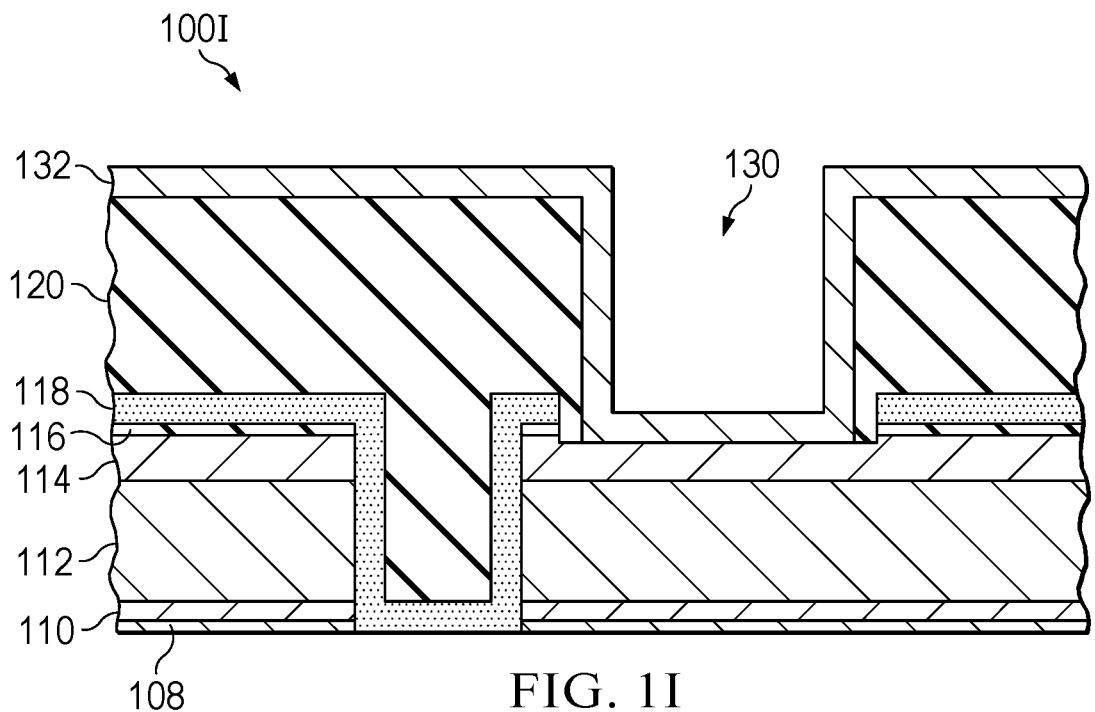

In FIG. 1I, a hinge metal 132 is deposited on SOC spacer layer 120 to form structure 100I. In this example, the preceding steps were performed to produce the appropriate shape and structure of structure 100H so a hinge metal 132 for an SLM could be deposited in FIG. 1I that has the proper shape and structure for the operation of the SLM.

Figure 1J:
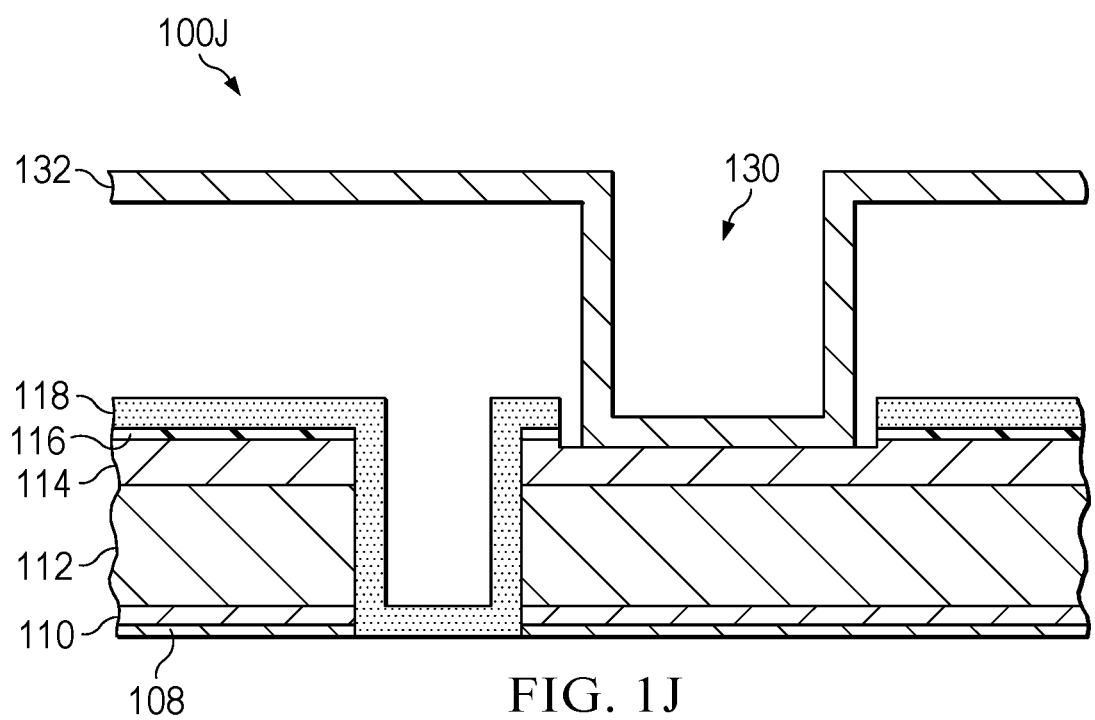

Additional processing steps may be performed to create an SLM, such as creating a mirror coupled to hinge metal 132 for the MEMS device. Those additional steps are omitted for simplicity. FIG. 1J, however, shows a structure 100J that is a portion of an SLM after SOC spacer layer 120 has been removed. Therefore, after all of the layers and components of the MEMS device are constructed, an etch may be performed to remove the spacer layers such as SOC spacer layer 120. The components of the MEMS device are built upon the spacer layers, and removing the spacer layers releases the device and allows the components to move freely during operation. In this example, structure 100J shows that removing SOC spacer layer 120 allows the hinge composed of hinge metal 132 to move up and down as needed during the operation of the MEMS device.

With the processes described in FIGS. 1A-1J, a spacer layer (such as SOC spacer layer 120) may be created that is flat and has a uniform thickness. In some examples, flatness may be measured by atomic force microscopy or interferometry. The examples herein may achieve surfaces that are 25% to 60% more flat than other solutions, based on the topography of the surface. For example, a spacer layer for a 5.4 micrometer pixel design may exhibit a flatness measurement (e.g., topography) that is reduced from 180 nm to 80 nm. In another example, a spacer layer for a 4.5 micrometer pixel may exhibit a flatness measurement that is reduced from 70 nm to 50 nm. Also, the spacer layer may be thinner than spacer layers created with photoresist in conventional solutions. For example, layers thinner than 400 nm may be difficult to achieve with photoresist, but are achievable with the examples herein. A thinner spacer layer allows smaller MEMS devices to be constructed.

FIGS. 2A to 2E show an example process flow for a MEMS device with an SOC spacer layer in accordance with various examples herein. The components shown in FIGS. 2A to 2E are not necessarily drawn to scale. The layers of the structures shown in FIGS. 2A to 2E are described above with respect to FIGS. 1A to 1J, and like numbers denote like components. This example shows only a portion of the manufacturing steps for simplicity. The portion of the steps that are described herein relate to the etching of the SOC spacer layer and the etching of an ARCox layer. With the use of the SOC as a spacer layer, thinner, flatter, and more precise MEMS devices may be manufactured. Etching the ARCox layer using the process in this example can provide better alignment for features in a MEMS device, such as a via. Also, etching the ARCox layer using the process may eliminate certain manufacturing steps, which may reduce wafer cost.

Figure 2A:
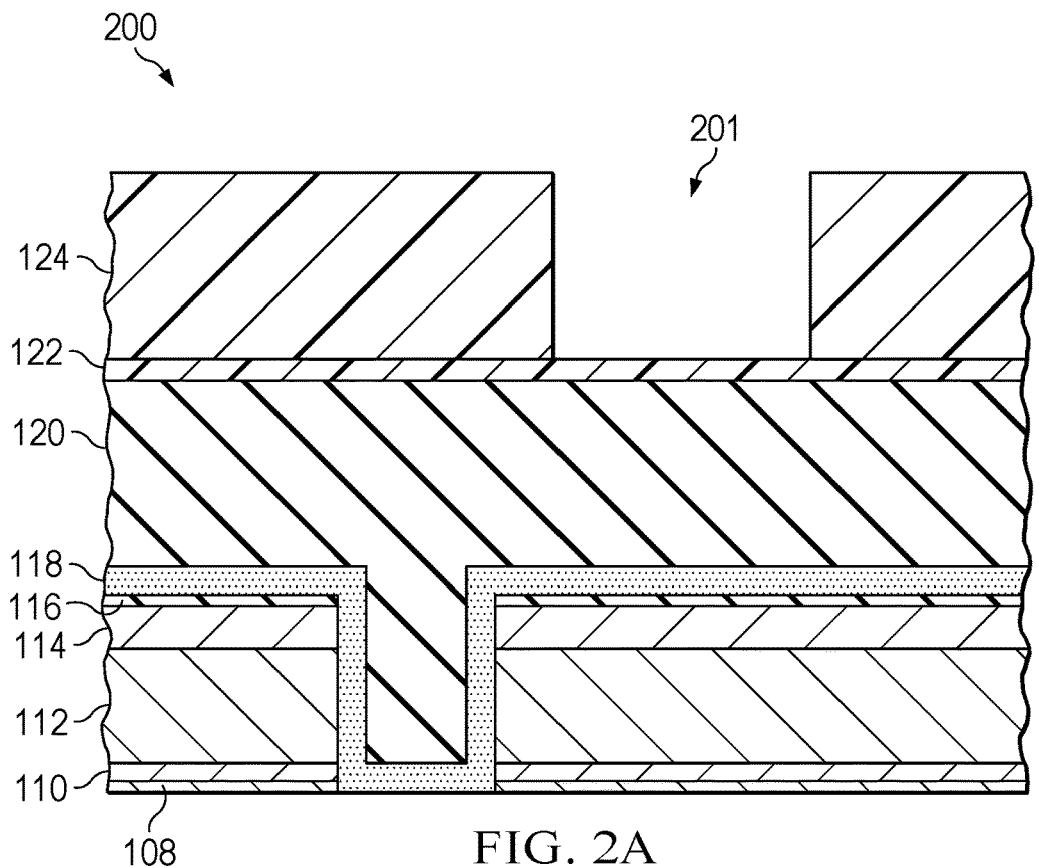
FIGS. 2A to 2E are an example process flow for a MEMS device with an organic polymer spacer layer in accordance with various examples.
Figure 2B:
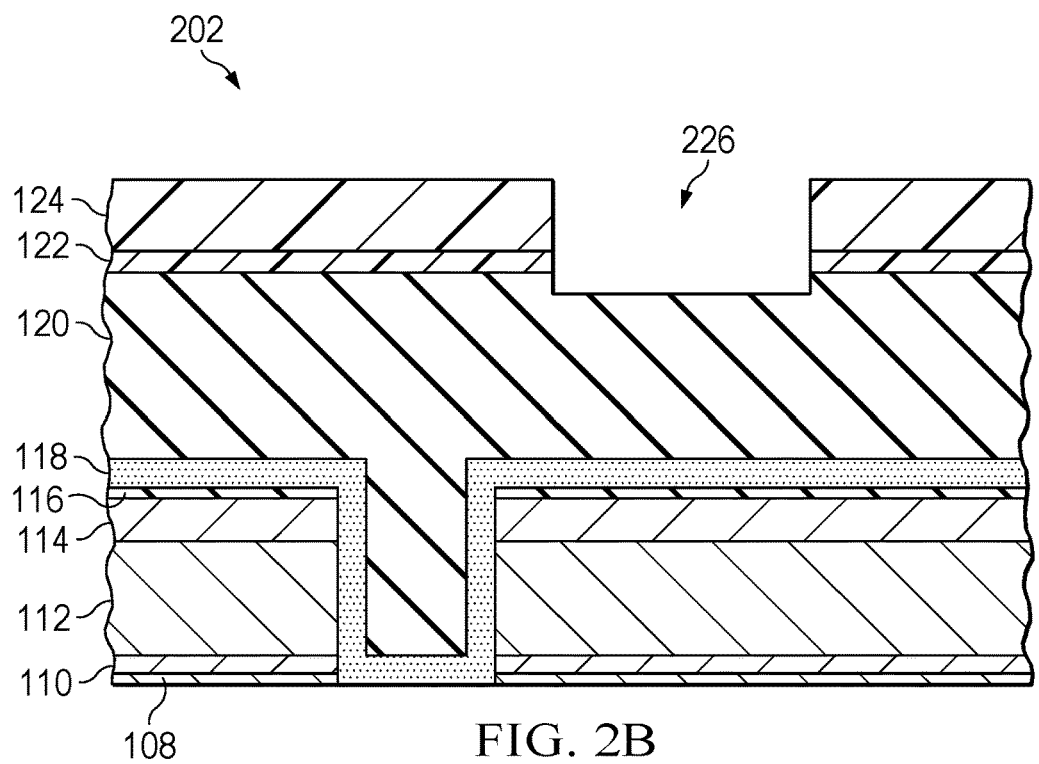
Figure 2C:
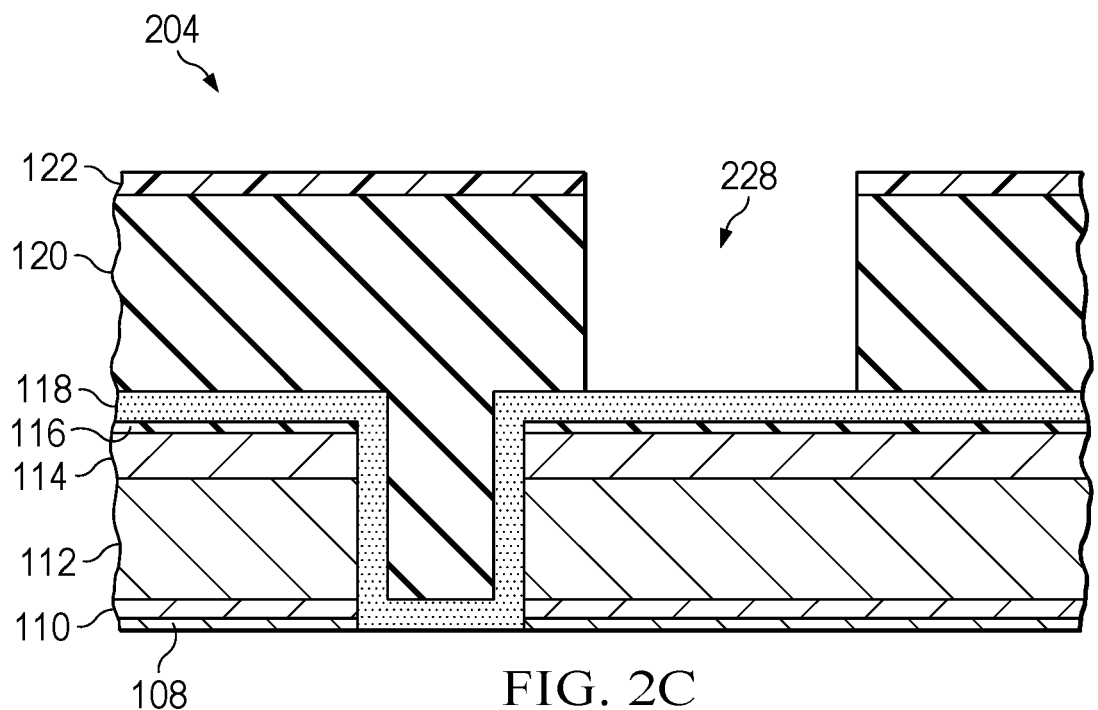
Figure 2D:
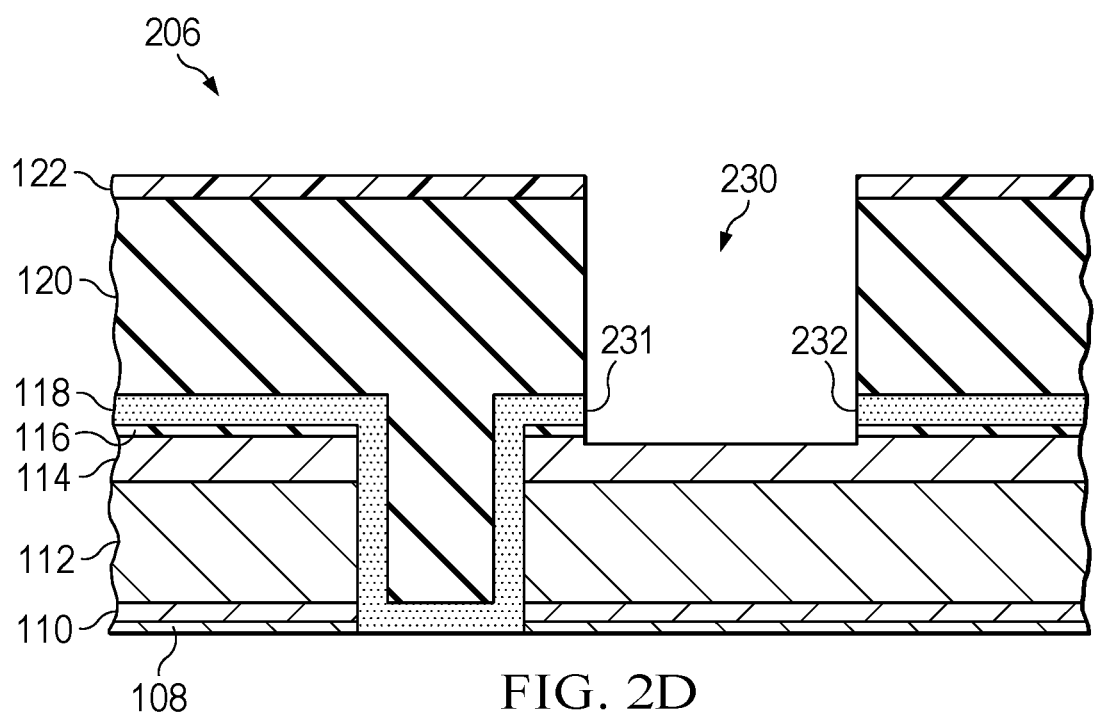
Figure 2E:
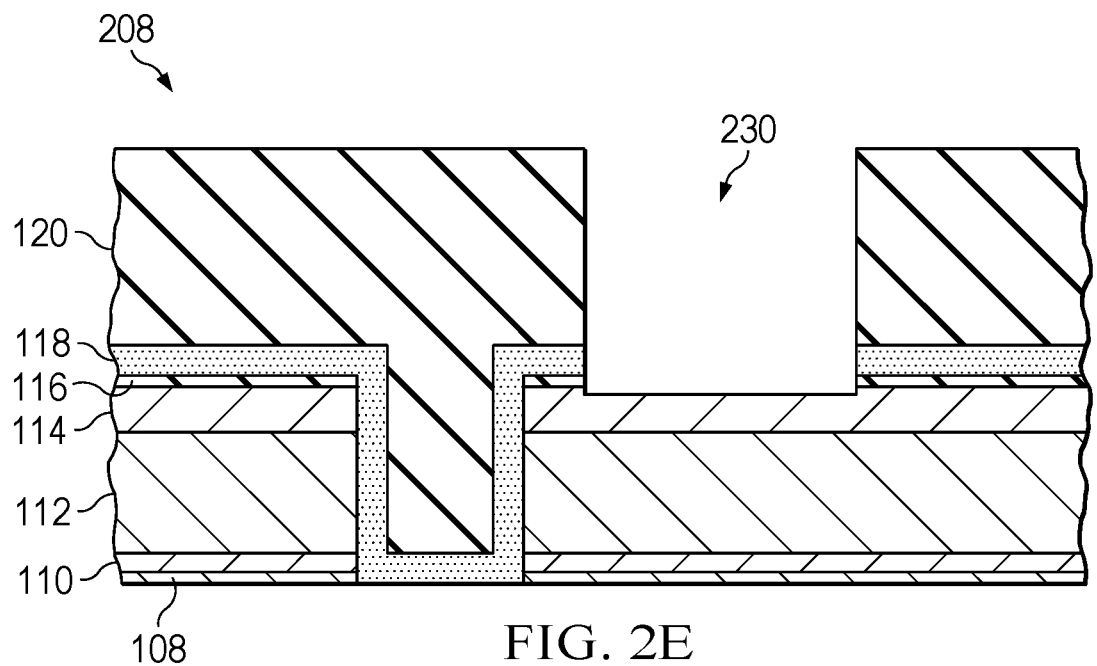

FIGS. 2A to 2E show a structure where layers 118, 116, and 114 are etched after SOC spacer layer 120 is deposited. In contrast, FIGS. 1A-1D show a structure where layers 118, 116, and 114 are etched before SOC spacer layer 120 is deposited. By etching layers 118, 116, and 114 as shown in FIGS. 2A to 2E, the etched edges of layers 114, 116, 118, and 120 may be self-aligned. Etching these layers with one process rather than separate processes (as in FIGS. 1A-1D) may provide better alignment of the etched edges of the layers. Self-aligned processes may reduce or eliminate a gap between materials, such as a gap between an ARC layer and a hinge, as described with respect to FIG. 4 below. FIG. 2B shows a structure 202, FIG. 2C shows a structure 204, FIG. 2D shows a structure 206, and FIG. 2E shows a structure 208. Structures 202, 204, 206, and 208 are described below. The structures shown in FIGS. 2A-2E may be a portion of a spatial light modulator (such as a DMD) in one example. However, the techniques described herein may be applied to other MEMS devices. A number of layers of different materials have been deposited, patterned, and etched to create structure 200 shown in FIG. 2A. The details of the steps for creating structure 200 are omitted herein.

FIG. 2A shows a portion of a structure 200 of a MEMS device in accordance with an example herein. Structure 200 includes layers 108, 110, 112, 114, and 116. Layer 118 is an ARCox layer. Structure 200 also includes SOC spacer layer 120, hard mask 122, and photoresist 124. Photoresist 124 has been patterned and etched to form the structure 200, including the etched portion 201 of photoresist 124.

In FIG. 2B, an etch of hard mask 122 is performed to remove hard mask 122 at location 226. FIG. 2B shows structure 202 after the etch is performed on structure 200 of FIG. 2A. In one example, the etch is a fluorine-based etch. In this example, the etch selectivity between hard mask 122 and SOC spacer layer 120 may be approximately 1.4. As shown in FIG. 2B, some of the SOC spacer layer 120 may be removed along with the hard mask 122, due to the small value of the selectivity for this etch.

In FIG. 2C, an etch of SOC spacer layer 120 is performed to remove SOC spacer layer 120 at location 228. FIG. 2C shows structure 204 after the etch is performed on structure 202 of FIG. 2B. In one example, the etch is an oxygen-based etch. In this example, the etch selectivity between SOC spacer layer 120 and hard mask 122 is greater than 80. A selectivity in this range allows SOC spacer layer 120 to be removed at location 228 while removing little of hard mask 122. SOC spacer layer 120 is removed to expose ARCox layer 118 at location 228.

Figure 3A:
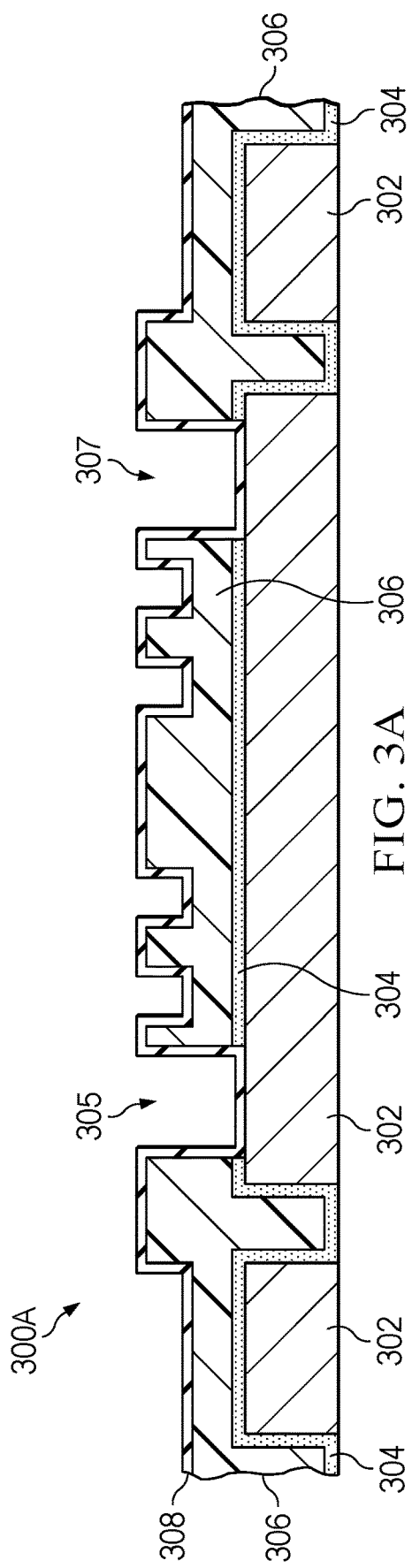

In FIG. 2D, an etch of ARCox layer 118 and layer 116 is performed. FIG. 2D shows structure 206 after the etch is performed on structure 204 of FIG. 2C. In one example, the etch is a fluorine-based ARCox etch. The etch selectivity between ARCox layer 118 and hard mask 122 may be greater than 10 in this example. Therefore, ARCox layer 118 and layer 116 may be removed at location 230 while removing little of hard mask 122. The fluorine-based etch of FIG. 2D is performed to create a via in ARCox layer 118 and layer 116 at location 230 that is aligned with the SOC spacer layer 120. Location 230 includes edges 231 and 232. Therefore, if additional processing is performed to deposit a material or create a structure in the via at location 230, the structure created may be adjacent to or adjoining edges 231 and 232, and may therefore exhibit better alignment and less gap between the structure itself and ARCox layer 118. This is referred to herein as a self-aligned component or structure. The component or structure is self-aligned in this example due to etching ARCox layer 118 after SOC spacer layer 120 is etched. Another example of a self-aligned component or structure is shown in FIG. 3A, described below, where vias 305 and 307 include a hinge layer 308 that has edges that are aligned with the edges of ARCox layer 304. Another self-aligned via in accordance with one example is described below with respect to FIG. 4.

In FIG. 2E, another etch of hard mask 122 is performed to remove hard mask 122. FIG. 2E shows structure 208 after the etch is performed on structure 206 of FIG. 1D. In one example, the etch is a fluorine-based etch. In this example, the etch selectivity between hard mask 122 and SOC spacer layer 120 may be approximately 1.4. Also, in this example, removing hard mask 122 with an etch does not materially affect metal 114 at location 230. After this etch of hard mask 122 is performed, other processing steps may be performed using the remaining SOC spacer layer 120 as a spacer for creating components of the MEMS device. With the processes described in FIGS. 2A-2E, a spacer layer may be created that is flat and has a uniform thickness. Also, the spacer layer may be thinner than spacer layers created with photoresist in conventional solutions.

FIGS. 3A to 3J show an example process flow for a MEMS device with an SOC spacer layer in accordance with various examples herein. The components shown in FIGS. 3A-3J are not necessarily drawn to scale. This example shows only a portion of the manufacturing steps for simplicity. The portion of the steps that are described herein relate to the etching of one of the SOC spacer layers in the MEMS device. With the use of the SOC as a spacer layer, thinner, flatter, and more precise MEMS devices may be manufactured.

FIG. 3A shows a portion of a structure 300A of a MEMS device in accordance with an example herein. The structures shown in FIGS. 3A-3J is a cross-section view of a portion of a spatial light modulator (such as a DMD) in one example. FIGS. 3A-3J show a structure that may be manufactured after FIG. 1D or after FIG. 2E. The structure may be a portion of a micromirror device that includes a hinge structure created with one or more spacer layers. However, the techniques described herein may be applied to other MEMS devices. A number of layers of different materials have been deposited, patterned, and etched to create structure 300A. The details of the steps for creating structure 300A are omitted herein.

Structure 300A includes a metal layer 302, which has been patterned and etched in previous steps to create the shape shown in FIG. 3A. Structure 300 includes an ARCox layer 304 deposited and etched on metal layer 302. Structure 300 includes a first spacer layer 306. First spacer layer 306 is deposited, patterned, and etched to create the shape and structure shown here. First spacer layer 306 may be deposited and then patterned and etched with photoresist, hard masks, or using any suitable technique or techniques. After patterning and etching, first spacer layer 306 has the shape shown in structure 300A. Vias 305 and 307 are also created as shown in structure 300A. This shape for first spacer layer 306 is created so the final hinge in the MEMS device will have the appropriate shape for operation. After first spacer layer 306 is created, hinge layer 308 is deposited on first spacer layer 306. Therefore, hinge layer 308 has the shape and structure shown in FIG. 3A due to the prior etching and processing of first spacer layer 306. In this example, hinge layer 308 is shown as extending across the entire portion of structure 300A shown here. However, depending on where the cross-section of the device is drawn, the hinge layer 308 may appear differently, as some portions may be visible while other portions may not. Hinge layer 308 may appear differently if another cross-section view is used.

Figure 3B:
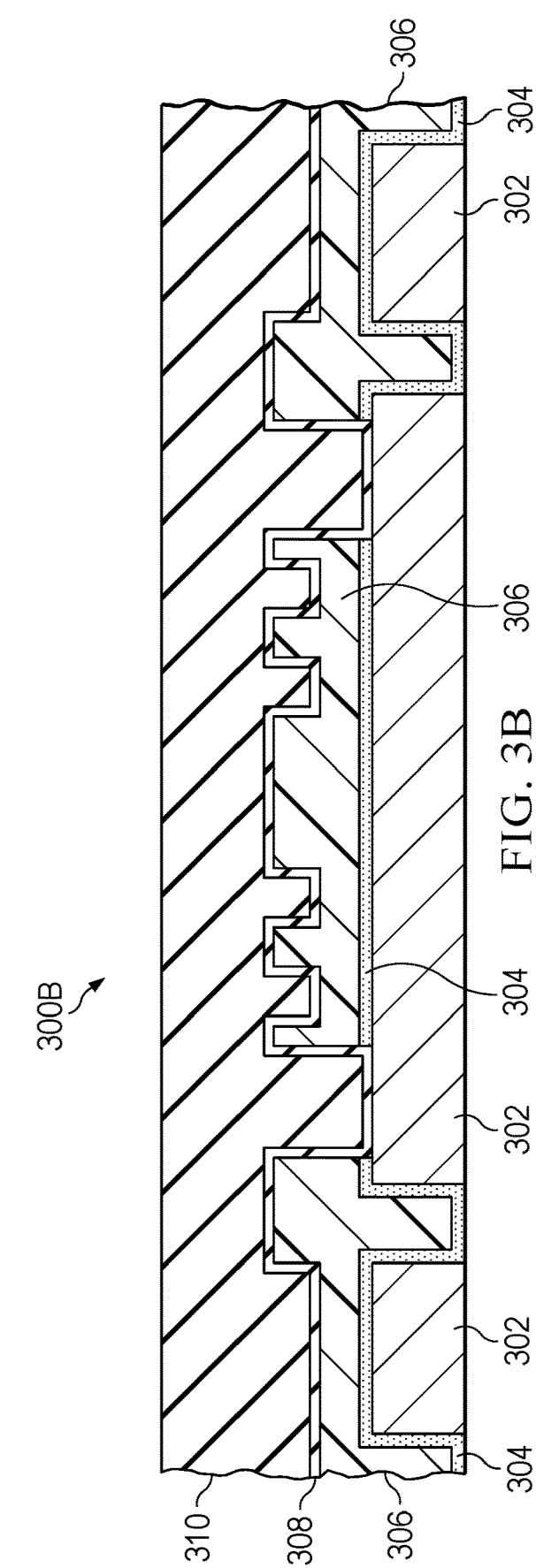

In FIG. 3B, second spacer layer 310 is deposited on hinge layer 308 as shown in structure 300B. First spacer layer 306 and second spacer layer 310 are SOC spacer layers in this example. Second spacer layer 310 may be used to produce additional structures as described below.

In FIG. 3C, hard mask 312 is deposited on second spacer layer 310 as shown in structure 300C. Hard mask 312 is useful in subsequent processing steps described below.

In FIG. 3D, photoresist 314 is deposited on hard mask 312 as shown in structure 300D. Photoresist may be patterned in later steps as described below.

In FIG. 3E, photoresist 314 has been patterned at location 316 to expose hard mask 312 as shown in structure 300E. In the process described below, portions of second spacer layer 310 are then etched to expose hinge layer 308.

In FIG. 3F, an etch of hard mask 312 is performed to remove hard mask 312 at location 322, as shown in structure 300F. FIG. 3B shows structure 300F after the etch is performed on structure 300E of FIG. 3E. In one example, the etch is a fluorine-based etch. In this example, the etch selectivity between hard mask 312 and second spacer layer 310 may be approximately 1.4. As shown in FIG. 3F, some of the second spacer layer 310 may be removed along with the hard mask 312 at location 322, due to the small value of the selectivity for this etch.

Figure 3G:
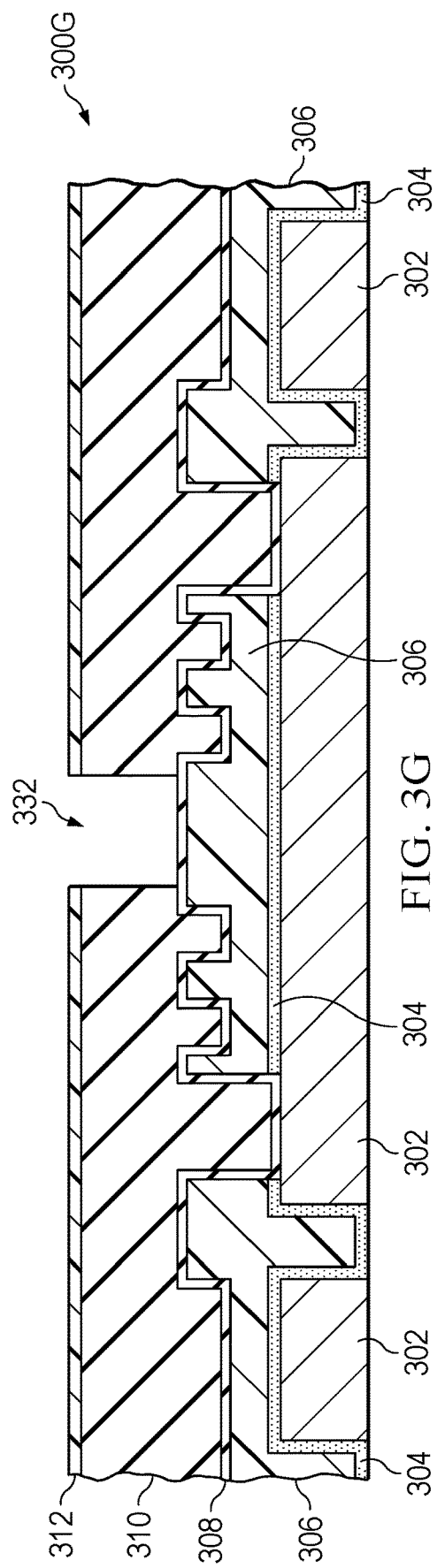

In FIG. 3G, an etch of second spacer layer 310 is performed to remove second spacer layer 310 at location 332, and to remove photoresist 314. FIG. 3G shows structure 300G after the etch is performed on structure 300F of FIG. 3F. In one example, the etch is an oxygen-based etch. In this example, the etch selectivity between second spacer layer 310 and hard mask 312 is greater than 80. An etch selectivity in this range allows second spacer layer 310 to be removed at location 332 while removing little of hard mask 312. Also, the etch selectivity between second spacer layer 310 and hinge layer 308 is greater than 200 in this example. Therefore, second spacer layer 310 may be etched without removing portions of hinge layer 308. Second spacer layer 310 is removed to expose hinge layer 308 at location 332.

Figure 3H:
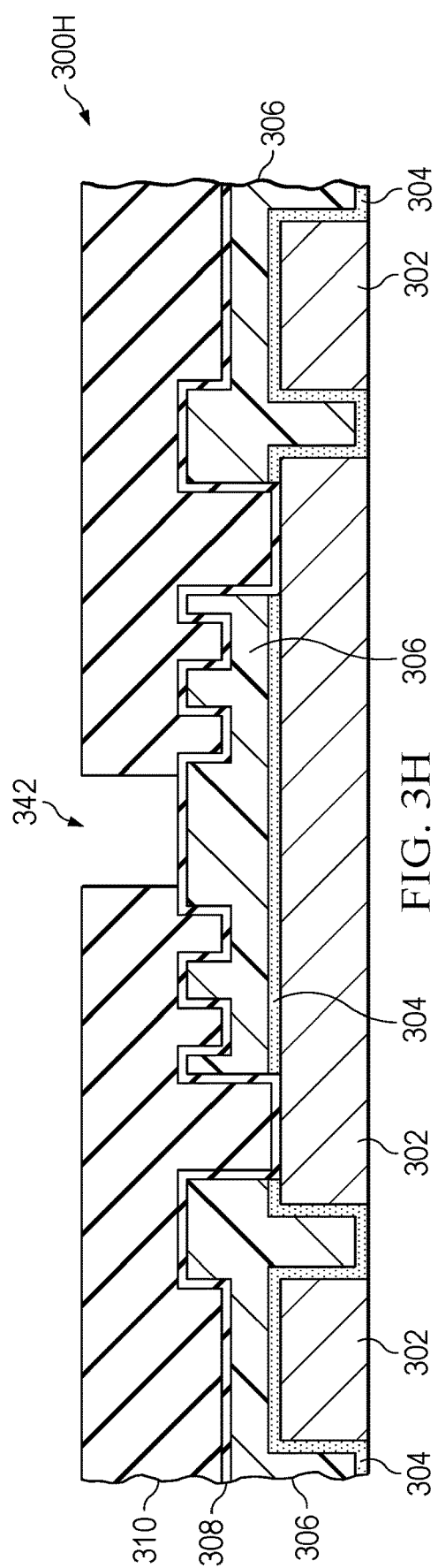

In FIG. 3H, another etch of hard mask 312 is performed to remove hard mask 312. FIG. 3H shows structure 300H after the etch is performed on structure 300G of FIG. 3G. In one example, the etch is a fluorine-based etch. In this example, the etch selectivity between hard mask 312 and second spacer layer 310 may be greater than 7. Also, in this example, removing hard mask 312 via etching does not materially affect hinge layer 308 at location 342. An etch selectivity between hard mask 312 and hinge layer 308 may be greater than 5 in one example. After this etch of hard mask 312 is performed, other processing steps may be performed to complete the MEMS device, as described below.

Figure 3I:
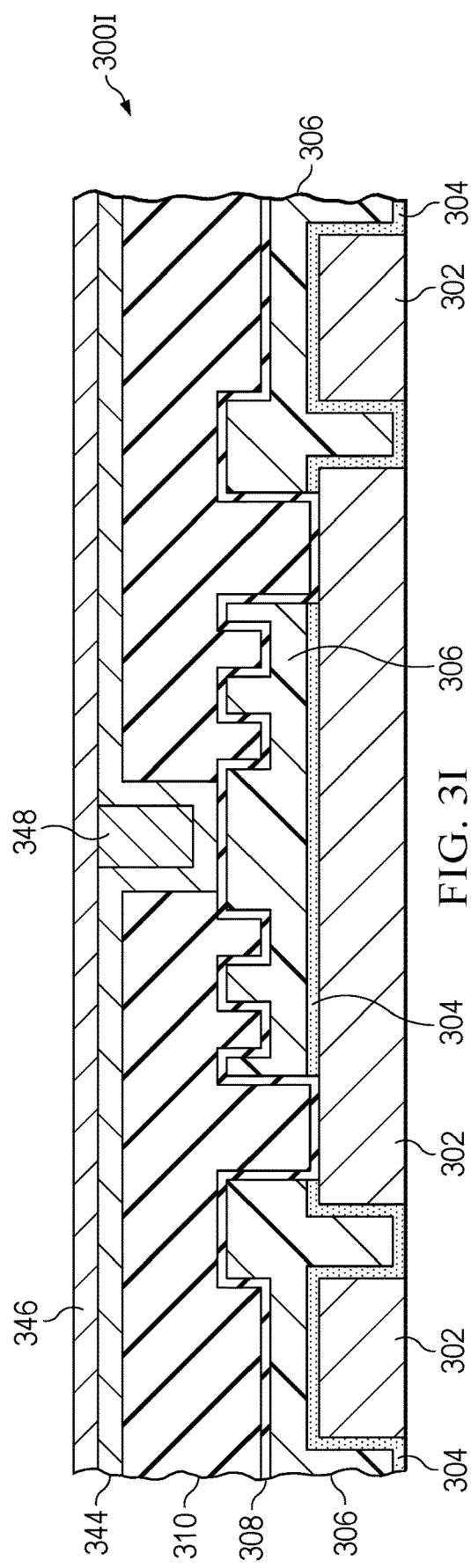

For a MEMS device with a mirror, such as an SLM, FIG. 3I shows mirror layers 344 and 346 deposited on second spacer layer 310. The mirror layers 344 and 346 may be aluminum in one example. Structure 300I also shows a mirror via 348. A bottom of the mirror via 348 rests on hinge layer 308. First spacer layer 306 is between the bottom of mirror via 348 and ARCox layer 304. A portion of hinge layer 308 rests on first spacer layer 306. Second spacer layer 310 is between mirror layer 344 and portions of hinge layer 308. A number of additional processing steps may be performed to create a mirror for an SLM. Those steps are omitted here for simplicity, with just a portion of the final deposited mirror shown in structure 300I. Second spacer layer 310 may be patterned and etched in any suitable manner to create a flat surface for the deposition of mirror layers 344 and 346.

Figure 3J:
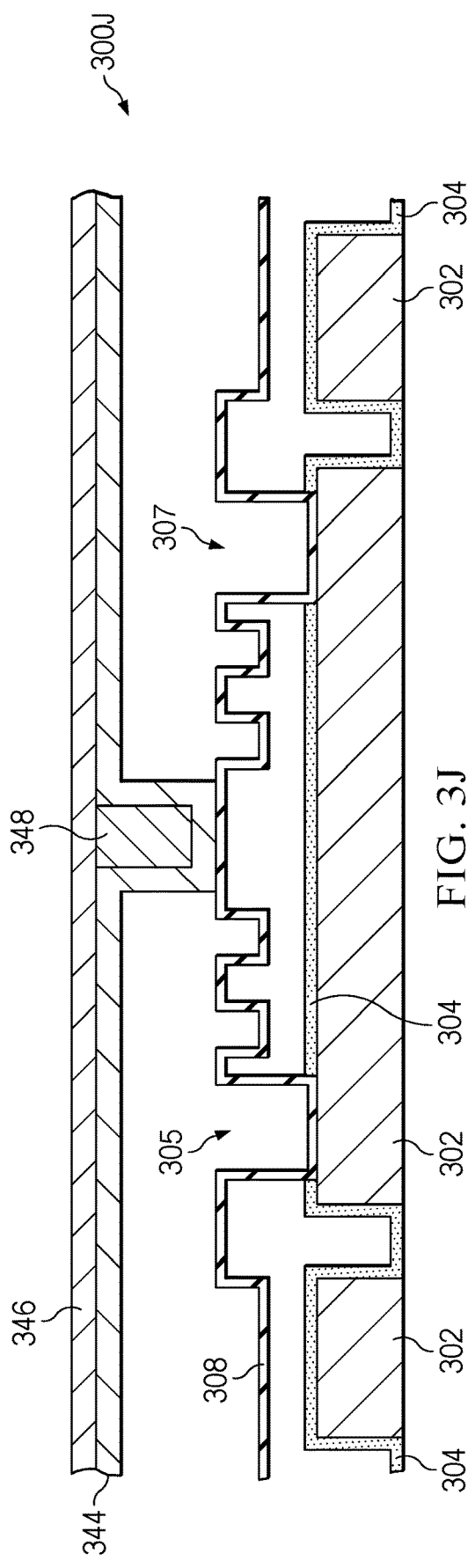

In FIG. 3J, first spacer layer 306 and second spacer layer 310 have been removed to release the components of the MEMS device, such as hinge layer 308 and mirror layers 344 and 346. A dry or wet etch may be used in some examples to remove the spacer layers. After removal of the spacer layers, the hinge and mirror are free to move during the operation of the device.

With the processes described in FIGS. 3A-3J, one or more SOC spacer layers may be created that are flat and have a uniform thickness. These SOC spacer layers may be useful for forming MEMS devices. The SOC spacer layers may be thinner than spacer layers created with photoresist. These thinner SOC spacer layers allow for smaller MEMS devices to be constructed.

In the examples described above, various etch chemistries are provided as examples, such as a fluorine-based etch or an oxygen-based etch. Other etch chemistries may be useful in other examples. The etch chemistries may be selected based on the properties of the materials that make up the MEMS device. The examples described above include multi-step etch processes for etching a hard mask, etching the organic spacer layer, removing photoresist, and stripping the hard mask. Other steps may be performed in other examples, such as depositing and etching other materials in a different combination of steps to build MEMS structures using an organic spin-coated polymer as a spacer.

The organic spin-coated polymers described herein (such as a SOC) may be thermally cured in some examples. These materials may be cured between 180-220° C. in one example, and may be stable up to higher temperatures, such as 240° C. Some metals useful for MEMS devices should be kept below 225° C., so these organic spin-coated polymers may be thermally cured without damaging the metals. In some examples, organic spin-coated polymers allow flatter topographies to be created within MEMS devices. For example, conventional processes may have a topography of features on a surface that vary in height by approximately 200 nm, whereas the examples described herein using organic spin-coated polymers may create topographies of features that vary less than 60 nm. Also, organic spin-coated polymers allow spacer layers to be created with thicknesses less than 400 nm, which allows for smaller MEMS devices to be formed.

Figure 4:
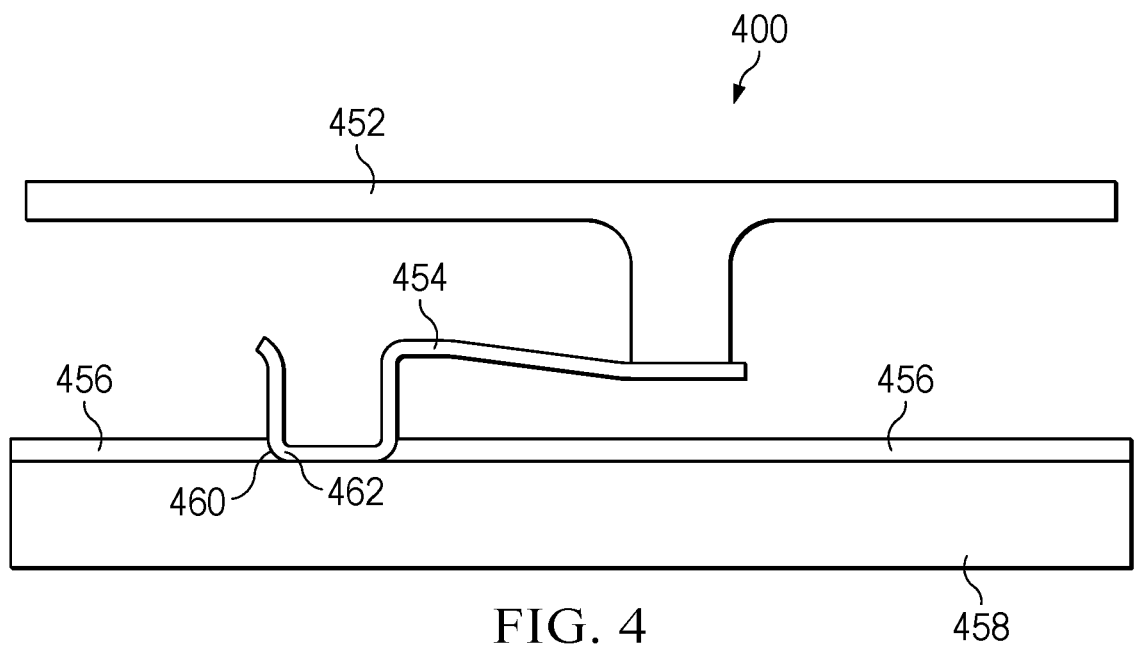
FIG. 4 is a MEMS device without a via gap in accordance with various examples.

FIG. 4 shows a MEMS device 400 without an ARC via gap in accordance with various examples herein. MEMS device 400 may be created using the techniques described above with respect to FIGS. 3A-3J in one example. MEMS device 400 is a portion of a DMD that includes a hinge, mirror, and substrate. MEMS device 400 includes a micromirror 452, a hinge 454, ARC layer 456, and substrate 458. MEMS device 400 also includes edges 460 and 462. In this example, an SOC is used to create one or more spacer layers (such as first spacer layer 306 and second spacer layer 310). The spacer layers may be patterned and etched to create specific structures, and metals or other materials may then be deposited on the structured spacer layers to form components of the MEMS device 400, such as a hinge. The spacer layers may then be removed with an etch process that releases the components, such as the hinge, so the component can move freely during the operation of the MEMS device 400. The spacer layer and manufacturing process may be similar to the processes discussed above with respect to FIGS. 2A-2E. In that example, rather than patterning and etching ARCox layer 118 before SOC spacer layer 120, SOC spacer layer 120 is deposited and then patterned and etched before ARCox layer 118 is etched (or with the same etching process as ARCox layer 118). After ARCox layer 118 is etched (e.g., after structure 208 is created in FIG. 2E), hinge metal may be deposited in location 230 and the hinge metal will align with the exposed layers of ARCox layer 118 (e.g., the hinge metal is self-aligned with the ARCox layer 118). As shown in FIG. 4, and edge 460 of ARC layer 456 is adjoining or aligned with an outer edge 462 of hinge 454, with no gap between the two components. Therefore, in examples herein, an SOC spacer layer allows for self-aligned ARC vias and for the self-alignment of other components of MEMS devices. Because the gaps are eliminated or reduced (e.g., there is little or no gap between ARC layer 456 and hinge 454 in this example), process yield may be increased. Wafer costs may also be reduced in some examples. As shown in FIG. 4, substrate 458 is covered by ARC layer 456, which avoids the reduced contrast caused by gaps between ARC layer 456 and hinge 454 in some processes. The lack of a gap also increases the mechanical integrity of hinge 454.

In one example, a DMD with a pixel pitch of 4.5 micrometers may have a hinge layer thickness (such as hinge layer 308) of approximately 210 Angstroms. The pixel pitch is the distance between the centers of two adjacent pixels. The DMD may have a first spacer layer thickness (e.g., first spacer layer 306) of approximately 3850 Angstroms. The DMD may have a second spacer layer thickness (e.g., second spacer layer 310) of approximately 5250 Angstroms. The DMD may have a mirror thickness (e.g., micromirror 452) of approximately 1325 Angstroms. Therefore, the techniques described herein may provide for smaller MEMS devices to be manufactured.

In some examples herein with an SOC spacer layer, the same process tool may be used for etching a hard mask, etching SOC spacer material, etching the ARC layer, and cleaning the spacer surface. The pattern photoresist may also be removed during the SOC spacer etch step. Because the same process tool is used, better alignment of components in the MEMS device 400 may be realized compared to a process that uses separate tools for different process steps.

Figure 5:
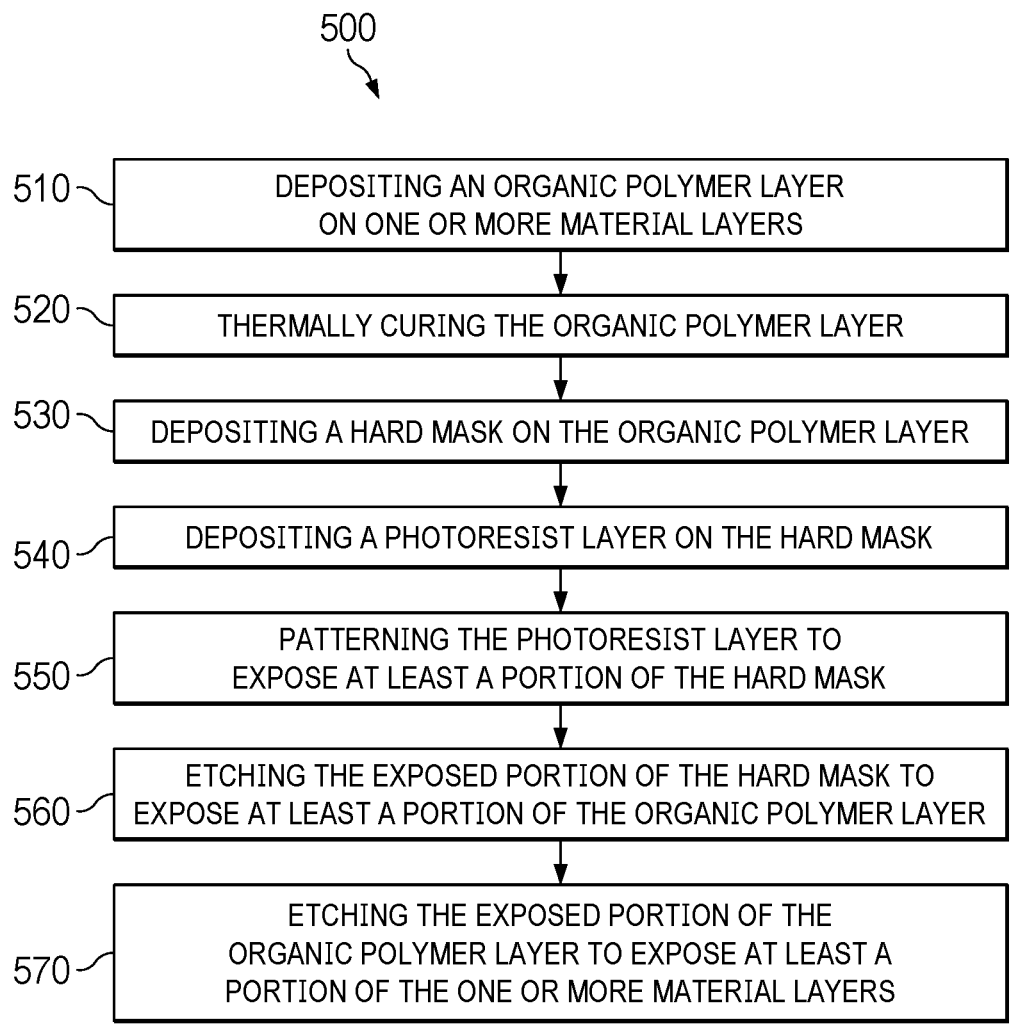
FIG. 5 is a flow diagram of a method for forming a MEMS device with an organic polymer spacer layer in accordance with various examples.

FIG. 5 is a flow diagram of a method 500 for forming a MEMS device with an organic polymer spacer layer in accordance with various examples herein. The steps of method 500 may be performed in any suitable order.

Method 500 begins at 510, where an organic polymer layer is deposited on one or more material layers. The material layers may be layers that are deposited on a substrate for a MEMS device, such as layers 108, 110, 112, 114, 116, and 118 described above. These layers may be deposited, patterned, and etched to create a portion of a MEMS device. The organic polymer layer may be a spacer layer in some examples. As shown in FIG. 1A, SOC spacer layer 120 is an organic polymer layer that is deposited on layer 118.

Method 500 continues at 520, where the organic polymer layer is thermally cured. SOC spacer layers may exhibit low cure temperatures (e.g., less than 200° C.) and good temperature stability compared to conventional processes. In one example, the organic polymer layer may be cured between 180° and 200° C.

Method 500 continues at 530, where a hard mask is deposited on the organic polymer layer. For example, hard mask 122 is deposited on SOC spacer layer 120 in FIG. 1A. In an example, a photoresist layer may be deposited on the hard mask at 540, and the photoresist layer may be patterned to expose at least a portion of the hard mask at 550. Method 500 continues at 560, where the exposed portion of the hard mask is etched to expose at least a portion of the organic polymer layer. FIG. 1B shows the etching of hard mask 122 with a fluorine-based etch in one example.

Method 500 continues at 570, where the exposed portion of the organic polymer layer is etched to expose at least a portion of the one or more material layers. FIG. 1C shows an oxygen-based etch of SOC spacer layer 120, which exposes metal 114 in this example.

Method 500 may continue with an optional action, where the hard mask is removed with an etch process. As an example, FIG. 1D shows a fluorine-based etch that removes hard mask 122. After this etch of hard mask 122 is performed, other processing steps may be performed using the remaining SOC spacer layer 120 as a spacer for forming components of the MEMS device. In another example, the hard mask removal may be skipped, and all or part of the hard mask may remain. Further processing steps may then be performed with the hard mask remaining. With the processes described in FIG. 5, a spacer layer may be formed that is flat and has a uniform thickness. Also, the spacer layer may be thinner than spacer layers created with photoresist in conventional solutions. A thinner spacer layer allows smaller MEMS devices to be constructed.

Figure 6:
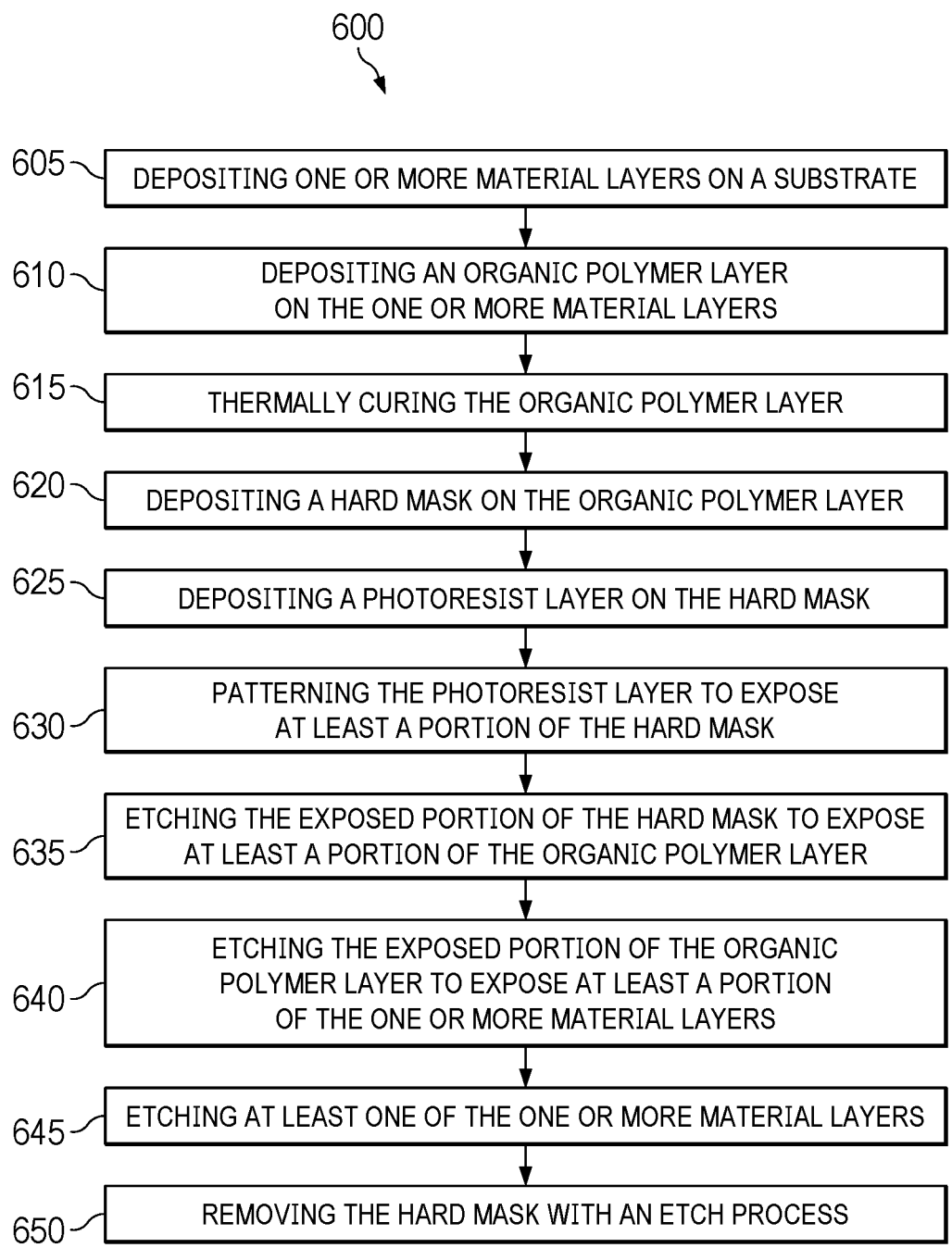
FIG. 6 is a flow diagram of a method for forming a MEMS device with an organic polymer spacer layer in accordance with various examples.

FIG. 6 is a flow diagram of a method 600 for forming a MEMS device with an organic polymer spacer layer in accordance with various examples herein. The steps of method 600 may be performed in any suitable order.

Method 600 begins at 605, where one or more material layers are formed on a substrate for a MEMS device. As an example, layers 108, 110, 112, 114, 116, and 118 shown in FIG. 2A are deposited, patterned, and etched to create a portion of a MEMS device.

Method 600 continues at 610, where an organic polymer layer is deposited on the one or more material layers. The organic polymer layer may be a spacer layer in some examples. As shown in FIG. 2A, SOC spacer layer 120 is an organic polymer layer that is deposited on layer 118.

Method 600 continues at 615, where the organic polymer layer is thermally cured. SOC spacer layers may exhibit low cure temperatures (e.g., less than 200° C.) and good temperature stability compared to conventional processes. In one example, the organic polymer layer may be cured between 180° and 200° C.

Method 600 continues at 620, where a hard mask is deposited on the organic polymer layer. For example, hard mask 122 is deposited on SOC spacer layer 120 in FIG. 2A. In an example, a photoresist may be deposited on the hard mask, and the photoresist may be patterned to expose at least a portion of the hard mask.

Method 600 continues at 625, where a photoresist layer is deposited on the hard mask. Any suitable photoresist and process may be used. Method 600 continues at 630, where the photoresist layer is patterned to expose at least a portion of the hard mask.

Method 600 continues at 635, where the exposed portion of the hard mask is etched to expose at least a portion of the organic polymer layer. FIG. 2B shows the etching of hard mask 122 with a fluorine-based etch.

Method 600 continues at 640, where the exposed portion of the organic polymer layer is etched to expose at least a portion of the one or more material layers. FIG. 2C shows an oxygen-based etch of SOC spacer layer 120, which exposes ARCox layer 118 in this example.

Method 600 continues at 645, where at least one of the one or more material layers is etched. In the example of FIG. 2D, an etch of ARCox layer 118 and layer 116 is performed. The etch in FIG. 2D is performed to create a via in ARCox layer 118 and layer 116 at location 230 that is aligned with the SOC spacer layer 120. Therefore, if additional processing is performed to deposit a material or form a structure in the via at location 230, the structure formed may exhibit better alignment and less gap between itself and ARCox layer 118.

Method 600 continues at 650, where the hard mask is removed with an etch process. As an example, FIG. 2E shows a fluorine-based etch that removes hard mask 122. After this etch of hard mask 122 is performed, other processing steps may be performed using the remaining SOC spacer layer 120 as a spacer for forming components of the MEMS device. With the processes described in FIG. 6, a spacer layer may be created that is flat and has a uniform thickness. Also, the spacer layer may be thinner than spacer layers created with photoresist in conventional solutions. A thinner spacer layer allows smaller MEMS devices to be constructed.

Figure 7:
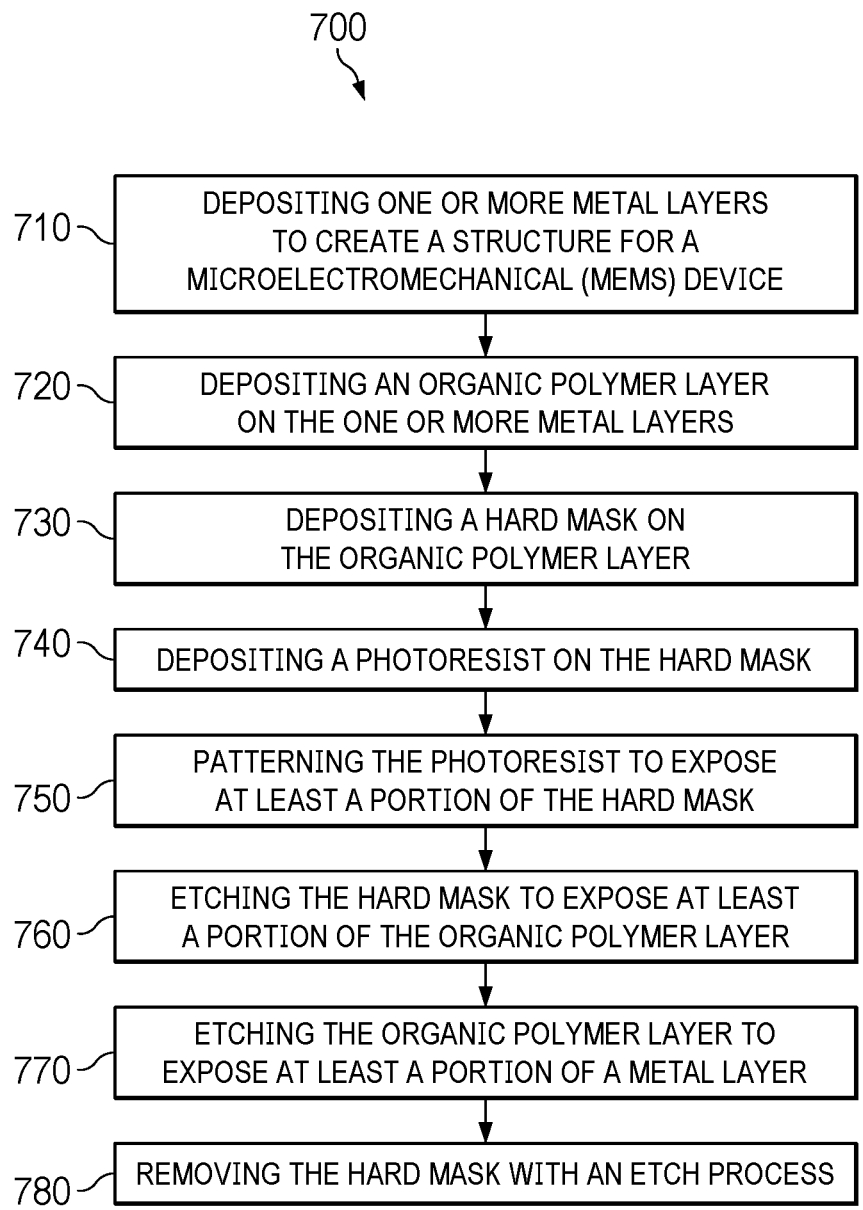
FIG. 7 is a flow diagram of a method for forming a MEMS device with an organic polymer spacer layer in accordance with various examples.

FIG. 7 is a flow diagram of a method 700 for forming a MEMS device with an organic polymer spacer layer in accordance with various examples herein. The steps of method 700 may be performed in any suitable order.

Method 700 begins at 710, one or more metal layers are deposited to create a structure for a MEMS device. As an example, hinge layer 308 shown in FIG. 3A is deposited to create a portion of a MEMS device. Portions of hinge layer 308 may be deposited on a substrate or on spacer layers or other metal layers that have been patterned and etched to provide the appropriate structure for a hinge. Hinge layer 308 may be a deposited film made by any techniques used to make thin metal films, such as, evaporation, physical vapor deposition, atomic layer deposition, etc. In this example, the hinge layer 308 is a hinge for a DMD. Metal layers such as hinge layer 308 may be useful for creating other components in other types of MEMS devices, such as springs, levers, actuators, etc.

Method 700 continues at 720, where an organic polymer layer is deposited on the one or more metal layers. The organic polymer layer may be a spacer layer in some examples. As shown in FIG. 3A, second spacer layer 310 is an organic polymer layer that is deposited on hinge layer 308. The organic polymer layer may also be thermally cured as described herein.

Method 700 continues at 730, where a hard mask is deposited on the organic polymer layer. For example, hard mask 312 is deposited on second spacer layer 310 in FIG. 3A. Method 700 continues at 740, where a photoresist is deposited on the hard mask. As shown in FIG. 3A, photoresist 314 is deposited on hard mask 312.

Method 700 continues at 750, where the photoresist is patterned to expose at least a portion of the hard mask. As shown in FIG. 3A, photoresist 314 is patterned at location 316 to expose a portion of hard mask 312.

Method 700 continues at 760, where the hard mask is etched to expose at least a portion of the organic polymer layer. FIG. 3B shows the etching of hard mask 312 with a fluorine-based etch.

Method 700 continues at 770, where the organic polymer layer is etched to expose at least a portion of the metal layer. FIG. 3C shows an oxygen-based etch of second spacer layer 310, which exposes hinge layer 308 in this example.

Method 700 continues at 780, where the hard mask is removed with an etch process. As an example, FIG. 3D shows a fluorine-based etch that removes hard mask 312. After this etch of hard mask 312 is performed, other processing steps may be performed using the remaining second spacer layer 310 as a spacer for forming components of the MEMS device. With the processes described in FIG. 7, a spacer layer may be formed that is flat and has a uniform thickness. Also, the spacer layer may be thinner than spacer layers created with photoresist in conventional solutions. A thinner spacer layer allows smaller MEMS devices to be constructed.

In examples herein, smaller and thinner MEMS devices may be manufactured using SOC spacer layers. The MEMS devices may also be manufactured at lower cost and with higher yield than other processes in accordance with some examples herein. The SOC spacer layer may be a non-photodefinable spacer layer in some examples. The SOC spacer layer may be thermally cured in some examples. The SOC spacer layer may be an anti-reflective layer in some examples. The use of SOC spacer layers may achieve flatter spacer layers than photoresist in some conventional processes. SOC spacer layers may provide better gap fill and planarization than some conventional processes. SOC spacer layers may exhibit low cure temperatures (e.g., less than 200° C.) and good temperature stability compared to conventional processes. Also, in some examples, metal films may be deposited and etched on top of multi-layer SOC structures.

Unless otherwise stated, "about," "approximately," or "substantially" preceding a value means +/−10 percent of the stated value. Modifications are possible in the described examples, and other examples are possible within the scope of the claims.

What is claimed is:

1. A method, comprising:
depositing an organic polymer layer on one or more material layers;
thermally curing the organic polymer layer;
depositing a hard mask on the organic polymer layer;
depositing a photoresist layer on the hard mask;
patterning the photoresist layer to expose at least a portion of the hard mask;
etching the exposed portion of the hard mask to expose at least a portion of the organic polymer layer;
etching the exposed portion of the organic polymer layer to expose at least a portion of the one or more material layers to form an opening;
removing the hard mask; and
depositing a metal layer on the organic polymer layer and in the opening of the organic polymer layer.

2. The method of claim 1, wherein at least one of the material layers is an anti-reflective coating layer.

3. The method of claim 1, wherein the material layers are deposited on a substrate for a microelectromechanical system (MEMS) device.

4. The method of claim 1, wherein the organic polymer layer is a spin-on carbon.

5. The method of claim 4, further comprising etching the spin-on carbon with an oxygen-based etch.

6. The method of claim 4, wherein the hard mask is etched with a fluorine-based etch.

7. The method of claim 1, wherein the organic polymer layer is an anti-reflective coating layer.

8. The method of claim 1, wherein the hard mask is a silicon-containing hard mask.

9. A method of manufacturing a microelectromechanical system (MEMS) device, the method comprising:
depositing one or more material layers on a substrate;
depositing an organic polymer layer on the one or more material layers;
thermally curing the organic polymer layer;
depositing a hard mask on the organic polymer layer;
depositing a photoresist layer on the hard mask;
patterning the photoresist layer to expose at least a portion of the hard mask;
etching the exposed portion of the hard mask to expose at least a portion of the organic polymer layer;
etching the exposed portion of the organic polymer layer to expose at least a portion of the one or more material layers to form an opening in the organic polymer layer;
etching at least one of the one or more material layers;
removing the hard mask with an etch process; and
forming a metal layer on the organic polymer layer and in the opening in the organic polymer layer.

10. The method of claim 9, wherein at least one of the material layers is an anti-reflective coating layer.

11. The method of claim 9, wherein etching the organic polymer layer and etching at least one of the one or more material layers produces a self-aligned component of the MEMS device.

12. The method of claim 9, wherein the organic polymer layer is a spin-on carbon.

13. The method of claim 12, further comprising thermally curing the spin-on carbon.

14. A method comprising:
depositing an organic polymer layer on one or more material layers;
depositing a hard mask on the organic polymer layer;
depositing a photoresist layer on the hard mask;
patterning the photoresist layer to expose at least a portion of the hard mask;
etching the exposed portion of the hard mask to expose at least a portion of the organic polymer layer;
etching the exposed portion of the organic polymer layer to expose at least a portion of the one or more material layers to form an opening;
removing the hard mask;
depositing a hinge layer on the organic polymer layer and in the opening of the organic polymer layer; and
removing the organic polymer layer, to release the hinge layer.

15. The method of claim 14, wherein the one or more material layers comprises an anti-reflective coating (ARC) layer, the method further comprising etching the ARC layer, wherein depositing the hinge layer further comprises depositing the hinge layer along an edge of the etched ARC layer.

16. The method of claim 14, wherein the organic polymer layer is spin-on carbon.

17. The method of claim 14, further comprising forming a mirror layer over the hinge layer.

* * * * *